United States Patent
Lee et al.

(10) Patent No.: US 10,290,687 B2
(45) Date of Patent: May 14, 2019

(54) LIGHTING APPARATUS USING ORGANIC LIGHT EMITTING DIODE AND METHOD OF FABRICATING THE SAME

(71) Applicant: LG Display Co., Ltd., Seoul (KR)

(72) Inventors: Shinbok Lee, Seoul (KR); Taejoon Song, Paju-si (KR); Namkook Kim, Suwon-si (KR); Soonsung Yoo, Goyang-si (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/701,017

(22) Filed: Sep. 11, 2017

(65) Prior Publication Data

US 2018/0151643 A1    May 31, 2018

(30) Foreign Application Priority Data

Nov. 30, 2016    (KR) .................. 10-2016-0162020

(51) Int. Cl.
*H01L 27/32* (2006.01)
*H01L 51/50* (2006.01)
*H01L 51/52* (2006.01)

(52) U.S. Cl.
CPC ........ *H01L 27/3244* (2013.01); *H01L 27/322* (2013.01); *H01L 51/504* (2013.01);
(Continued)

(58) Field of Classification Search
CPC ..... H01L 51/524–5259; H01L 27/3244; H01L 27/3258; H01L 27/3276; H01L 27/3288; H01L 27/3297
See application file for complete search history.

(56) References Cited

U.S. PATENT DOCUMENTS

2005/0051776 A1* 3/2005 Miyagi ............... G09G 3/3233
257/72
2009/0309489 A1* 12/2009 Takata ............... H01L 27/3246
313/504
(Continued)

FOREIGN PATENT DOCUMENTS

CN    103314642 A    9/2013
CN    104953039 A    9/2015
(Continued)

OTHER PUBLICATIONS

Extended European Search Report dated Jun. 13, 2018 in corresponding application EP 17 20 4724.3.
(Continued)

*Primary Examiner* — Mariceli Santiago
(74) *Attorney, Agent, or Firm* — Polsinelli PC

(57) ABSTRACT

A lighting apparatus using an organic light emitting diode and a method of fabricating the same according to the present disclosure is configured such that a contact electrode is formed using laser ablation and printing after an organic light emitting material, a conductive layer for a cathode and a passivation layer are deposited on an entire surface of a substrate, and then encapsulated with a metal film.
The present disclosure simplifies a fabricating process of the lighting apparatus by virtue of a non-use of an open mask (metal mask) as a sophisticated apparatus, and particularly, can be effectively applied to a roll-producing process.
Also, the present disclosure can provide an effect of improving reliability by preventing moisture permeation in a manner of covering an exposed contact portion with a protection film such as a barrier tape.

12 Claims, 19 Drawing Sheets

(52) U.S. Cl.
CPC ...... *H01L 51/5012* (2013.01); *H01L 51/5072* (2013.01); *H01L 51/5203* (2013.01); *H01L 51/5206* (2013.01); *H01L 51/5234* (2013.01); *H01L 51/5253* (2013.01); *H01L 27/3288* (2013.01); *H01L 51/5212* (2013.01); *H01L 2251/5361* (2013.01)

(56) References Cited

U.S. PATENT DOCUMENTS

| | | | | |
|---|---|---|---|---|
| 2011/0001146 | A1* | 1/2011 | Yamazaki | H05B 33/04 257/79 |
| 2013/0249390 | A1* | 9/2013 | Nishikawa | H01L 51/5203 313/512 |
| 2015/0282259 | A1* | 10/2015 | Yamada | H05B 33/04 313/512 |
| 2015/0295202 | A1 | 10/2015 | Ma | |
| 2016/0172618 | A1 | 6/2016 | Chen et al. | |
| 2017/0133628 | A1* | 5/2017 | Furuie | H01L 51/5246 |

FOREIGN PATENT DOCUMENTS

| | | |
|---|---|---|
| EP | 2 665 343 A1 | 11/2013 |
| FR | 2 998 096 A1 | 5/2014 |
| WO | 2015/174154 A1 | 11/2015 |
| WO | 2015173965 A1 | 11/2015 |

OTHER PUBLICATIONS

Office Action dated Feb. 27, 2019 with English translation issued in the corresponding Chinese Patent Application No. 201711236321.1, pp. 1-12.

* cited by examiner

LIGHTING APPARATUS USING ORGANIC LIGHT EMITTING DIODE AND METHOD OF FABRICATING THE SAME

CROSS-REFERENCE TO RELATED APPLICATION

Pursuant to 35 U.S.C. § 119(a), this application claims the benefit of an earlier filing date of and the right of priority to Korean Application No. 10-2016-0162020, filed on Nov. 30, 2016, the contents of which are incorporated by reference herein in its entirety.

BACKGROUND

Field of the Disclosure

The present disclosure relates to a display device, and more particularly, to a lighting apparatus using an organic light emitting diode and a method of fabricating the same, Although the present disclosure is suitable for a wide scope of applications, it is particularly suitable for simplifying a fabricating process in a lighting apparatus using an organic light emitting diode by patterning the organic light emitting diode without using an open mask.

Description of the Background

Currently, fluorescent or incandescent lamps are mainly used as lighting apparatuses. Among them, the incandescent lamps have a good color rendering index (CRI) but have low energy efficiency. The fluorescent lamps have high efficiency but have a poor color rendering index. In addition, the fluorescent lamps contain mercury, thereby causing an environmental problem.

The CRI is an index representing color rendering. The CRI is an index indicating a degree of similarity of color tones with respect to the color of an object illuminated by a light source, when comparing a case where the object is illuminated by a specific light source with a case where the object is illuminated by a reference light source. The CRI of sunlight is 100.

In order to solve the problem of the conventional lighting apparatus, recently, a light emitting diode (LED) has been proposed as a lighting apparatus. The LED is made of an inorganic light emitting material. The LED exhibits the highest light emission efficiency in a blue wavelength band, and has light emission efficiency that is gradually lowered toward a red wavelength band and a green wavelength band. Therefore, when white light is emitted by combining a red light emitting diode, a green light emitting diode, and a blue light emitting diode, the light emission efficiency is much lowered.

As an alternative, a lighting apparatus using an organic light emitting diode (OLED) is currently developed. A general lighting apparatus using an organic light emitting diode is fabricated in a manner of forming an anode electrode made of ITO on a glass substrate, forming an organic light emitting layer and a cathode electrode on the anode electrode, and attaching a passivation layer and a lamination film thereon.

Among others, a process of depositing the organic light emitting layer and the electrode is performed under a high vacuum atmosphere, and thus deposition chambers for maintaining the high vacuum are required as many as a number of thin films to be deposited.

In recent years, researches on using a flexible substrate instead of a glass substrate have been actively conducted. In this case, the flexible substrate is mainly installed on an apparatus by being rolled on a roller. A lighting apparatus is fabricated by using a roll-to-roll device which deposits thin film layers on such a flexible substrate while continuously transferring it. However, the number of all processes increases. In particular, during an organic light emitting diode process after forming an anode electrode, an organic light emitting layer, a cathode electrode, and a passivation layer are deposited using different open masks (metal masks) for each layer. In this case, after the deposition of thin film layers using the open masks, a washing process is further required every time of the deposition, and an alignment process between the substrate and the open mask is required. Also, when the substrate and the mask are misaligned, shadow and pattern tolerance are generated, which may cause a defective product.

SUMMARY

Therefore, an aspect of the present disclosure is to provide a lighting apparatus using an organic light emitting diode, in which the organic light emitting diode is deposited without using an open disk (metal mask), and a method of fabricating the same.

Another aspect of the present disclosure is to provide a lighting apparatus using an organic light emitting diode capable of enhancing reliability, and a method of fabricating the same.

Other aspects and features of the present disclosure will be described in the following configurations and claims of the present disclosure.

To achieve these and other advantages and in accordance with the purpose of this specification, as embodied and broadly described herein, there is provided a lighting apparatus using an organic light emitting diode, the apparatus including a substrate divided into a lighting portion, and first and second contact portion, a first electrode on the substrate, and a first passivation layer on the first electrode.

Also, the lighting apparatus may further include an organic light emitting layer, a second electrode and a second passivation layer on an entire surface of the substrate with the first passivation layer thereon, a trench constituted at the second contact portion of the substrate to disconnect the organic light emitting layer of the lighting portion from an organic light emitting layer of the second contact portion, and a metal film on the second passivation layer of the lighting portion of the substrate.

In an aspect disclosed herein, the first and second contact portions may be located at outside of the lighting portion. The second contact portion may be located along an outer periphery of the lighting portion, and the first contact portion may be located along an outer periphery of the second contact portion.

The first electrode may extend to the first contact portion to constitute a first contact electrode.

In an aspect disclosed herein, the lighting apparatus may further include a contact hole constituted by removing some portions of the organic light emitting layer, the second electrode, and the second passivation layer of the second contact portion, and exposing the first contact electrode therethrough.

In an aspect disclosed herein, the lighting apparatus may further include a protection film to cover an inner side surface of the contact hole and parts of surfaces of the first contact electrode and the second passivation layer.

The lighting apparatus may further include a second contact electrode on a side surface of the metal film along an outer periphery of the metal film.

In an aspect disclosed herein, the metal film may be constituted on the second passivation layer with an adhesive interposed therebetween, and the second contact electrode may be constituted on side surfaces of the metal film and the adhesive.

The second contact electrode may be filled in the trench to be electrically connected to the second electrode.

The trench may be constituted by removing some portions of the organic light emitting layer, the second electrode and the second passivation layer of the second contact portion so as to expose the first passivation layer therethrough.

The trench may be constituted in a shape of a rectangular frame along an outer periphery of the lighting portion within the second contact portion of the substrate.

Also, the apparatus may further include a contact hole constituted by removing some portions of the organic light emitting layer, the second electrode and the second passivation layer of the second contact portion so as to expose the first electrode therethrough, and a first contact electrode within the contact hole to be electrically connected to the first electrode.

To achieve these and other advantages and in accordance with the purpose of this specification, as embodied and broadly described herein, there is provided a method for fabricating a lighting apparatus using an organic light emitting diode, the method including forming a first electrode on a substrate divided into a lighting portion and first and second contact portions, forming a first passivation layer on the substrate with the first electrode thereon, forming an organic light emitting layer, a second electrode and a second passivation layer on an entire surface of the substrate with the first passivation layer thereon, attaching a metal film onto the second passivation layer of the lighting portion, and removing some portions of the organic light emitting layer, the second electrode and the second passivation layer of the second contact portion to form a trench form disconnecting the organic light emitting layer of the lighting portion from the organic light emitting layer of the second contact portion.

Here, the forming the trench may be performed after attaching the metal film onto the second passivation layer.

In an aspect disclosed herein, the first electrode may extend toward the first contact portion to form a first contact electrode.

The trench may be formed by removing some portions of the organic light emitting layer, the second electrode and the second passivation layer of the second contact portion through laser ablation, so as to expose the first passivation layer therethrough.

In an aspect disclosed herein, the method may further include forming a contact hole for exposing the first contact electrode by removing some portions of the organic light emitting layer, the second electrode and the second passivation layer of the second contact portion, when forming the trench.

In an aspect disclosed herein, the method may further include forming a protection film to cover an inner side surface of the contact hole and parts of surfaces of the first contact electrode and the second passivation layer.

The method may further include forming a second contact electrode on a side surface of the metal film as well as an inside of the trench, along an outer periphery of the metal film.

Also, the method may further include forming a contact hole for exposing the first electrode by removing some portions of the organic light emitting layer, the second electrode and the second passivation layer of the second contact portion, and forming a first contact electrode to be electrically connected to the first electrode through the contact hole.

As described above, according to a lighting apparatus using an organic light emitting diode in accordance with one aspect and a method of fabricating the same, a fabricating process of the lighting apparatus can be simplified by virtue of a non-use of an open mask (metal mask) as a sophisticated apparatus. Thus, a fabricating cost can be reduced and simultaneously processes and apparatuses can be simplified, thereby fabricating various models without an additional cost.

According to a lighting apparatus using an organic light emitting diode in accordance with one aspect and a method of fabricating the same, an organic light emitting diode can be patterned merely by a simple apparatus without an open mask and the like, thereby fabricating the lighting apparatus effectively using a roll-to-roll process.

Also, according to a lighting apparatus using an organic light emitting diode in accordance with one aspect and a method of fabricating the same, since laser processing is performed after encapsulation, a defect issue caused due to particles generated during the laser processing can be fundamentally prevented. In addition, a contact portion where moisture is likely to be introduced can be covered for protection, thereby ensuing reliability.

Further scope of applicability of the present application will become more apparent from the detailed description given hereinafter. However, it should be understood that the detailed description and specific examples, while indicating preferred aspects of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings.

DETAILED DESCRIPTION

Figure 1:
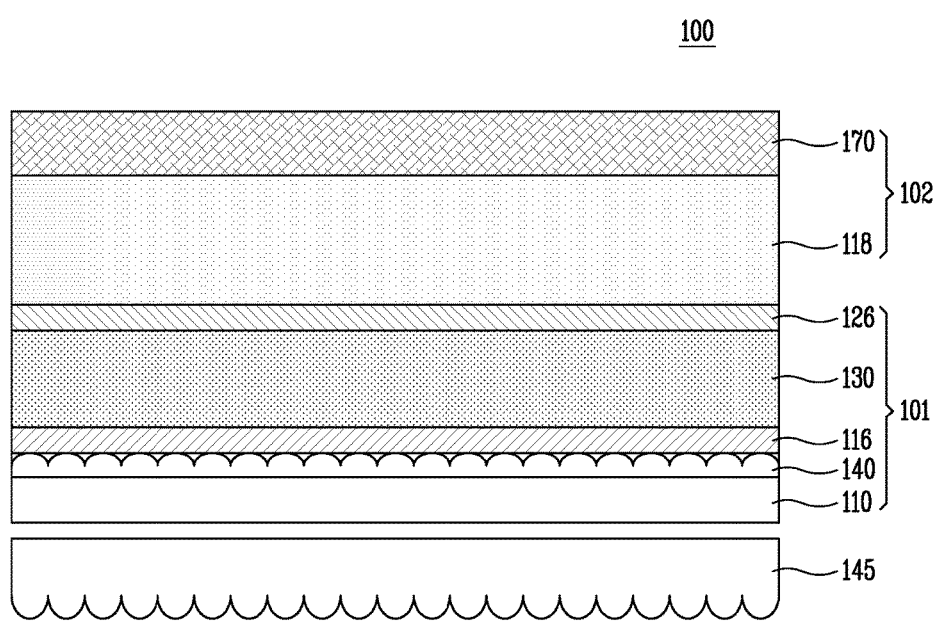
FIG. 1 is a cross-sectional view illustrating a lighting apparatus using an organic light emitting diode in accordance with an aspect of the present disclosure.

Description will now be given in detail of the aspects of a lighting apparatus using an organic light-emitting diode (OLED) and a method of fabricating the same according to the present disclosure, with reference to the accompanying drawings, such that those skilled in the art to which the present disclosure belongs can easily practice.

Advantages and features of the present disclosure and methods of achieving those will be obviously understood with reference to the accompanying drawings and exemplary aspects to be explained later in detail. Exemplary aspects of the inventive concepts may, however, be embodied in many different forms and should not be construed as being limited to the aspects set forth herein; rather, these aspects are provided so that this disclosure will be thorough and complete, and will fully convey the concept of example aspects to those of ordinary skill in the art. The same/like reference symbols refer to the same/like components throughout the specification. In the drawings, the thicknesses of layers and regions are exaggerated for clarity.

It will be understood that when an element is referred to as being "on" another element, the element can be located on the other element or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below.

The terminology used herein is for the purpose of describing particular aspects only and is not intended to be limiting of example aspects. As used herein, the singular forms are intended to include the plural forms as well, unless the context clearly indicates otherwise. It will be further understood that the terms "comprises", "comprising", "includes" and/or "including," if used herein, specify the presence of stated steps, operations, elements and/or components, but do not preclude the presence or addition of one or more other features, integers, steps, operations, elements, components and/or groups thereof.

FIG. 1 is a cross-sectional view exemplarily illustrating a lighting apparatus using an organic light emitting diode in accordance with an aspect of the present disclosure.

Figure 2:
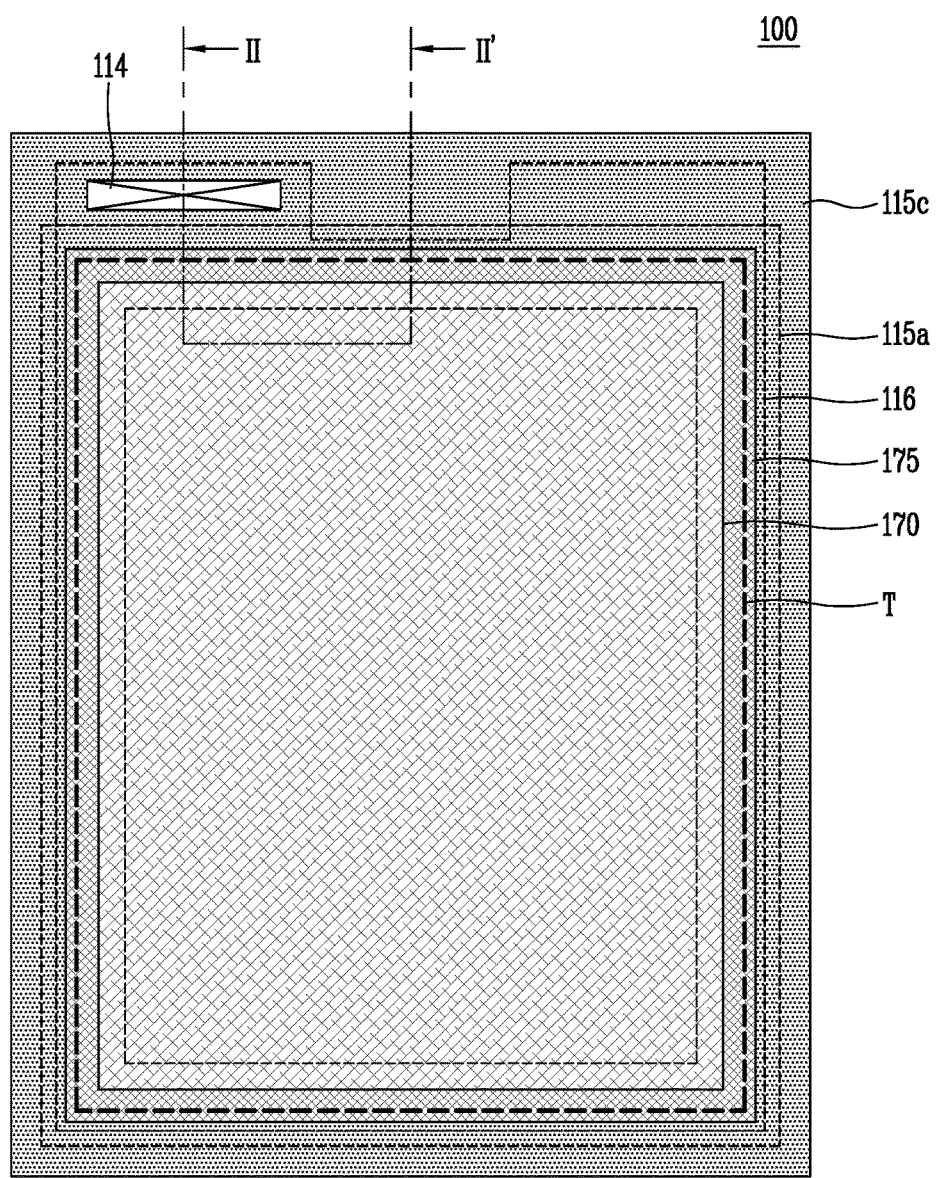
FIG. 2 is a planar view schematically illustrating a lighting apparatus using an organic light emitting diode in accordance with an aspect of the present disclosure.

FIG. 2 is a planar view schematically illustrating the lighting apparatus using the organic light emitting diode in accordance with the aspect of the present disclosure.

Figure 3:
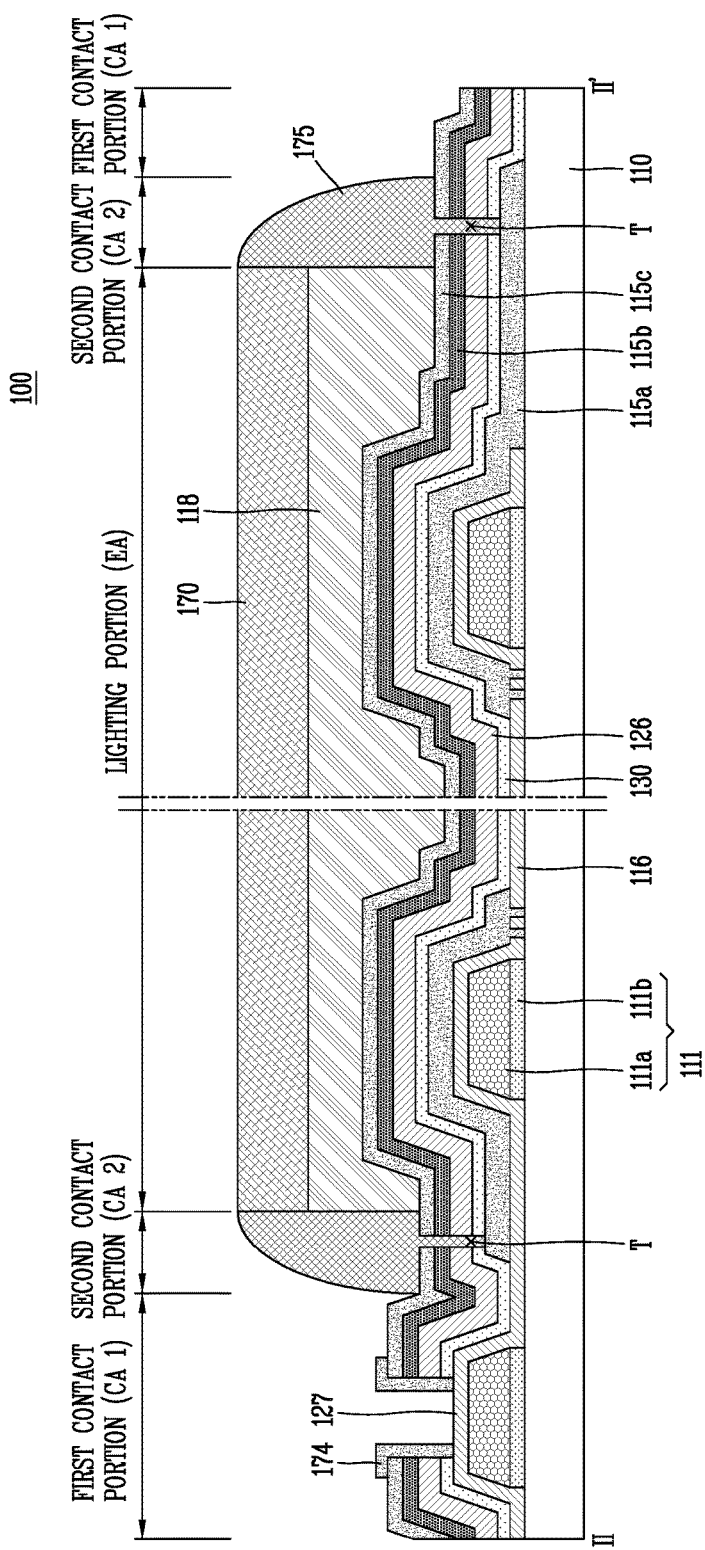
FIG. 3 is a schematic view illustrating a cross-section of the lighting apparatus using the organic light emitting diode, taken along line II-II' of FIG. 2.

And, FIG. 3 is a schematic view illustrating a cross-section of the lighting apparatus using the organic light emitting diode, taken along line II-II' of FIG. 2.

The present disclosure provides a lighting apparatus using an organic light emitting diode made of an organic material, other than a lighting apparatus using an inorganic light emitting diode made of an inorganic material.

The organic light emitting diode made of the organic light emitting material has relatively good light emission efficiencies of green and red light as compared with the inorganic light emitting diode. Further, since the organic light emitting diode has relatively wider widths of red, green and blue light emission peaks than the inorganic light emitting diode, the organic light-emitting diode has an improved CRI and thus emitted light thereof becomes more similar to sunlight.

In the following description, a lighting apparatus according to the present disclosure is described as a flexible lighting apparatus having flexibility. However, the present disclosure can be applied to a flexible lighting apparatus as well as to a non-flexible lighting apparatus.

As illustrated in FIGS. 1 to 3, a lighting apparatus 100 using an organic light emitting diode according to an aspect of the present disclosure may include an organic light emitting diode part 101 performing a surface emission, and an encapsulating part 102 encapsulating the organic light emitting diode part 101.

At this time, the lighting apparatus 100 may further include an external light extracting layer 145 provided beneath the organic light emitting diode part 101 to increase haze.

The external light extracting layer 145 may be formed by dispersing scattering particles, such as $TiO_2$, in resin and attached to a lower portion of a substrate 110 using an adhesive layer (not illustrated).

The organic light emitting diode part 101 may be configured as an organic light emitting diode disposed on the substrate 110, and in this instance, an internal light extracting layer 140 may be further provided between the substrate 110 and the organic light emitting diode.

A planarizing layer (not illustrated) may further be provided on the internal light extracting layer 140.

In this instance, the substrate 110 may include a lighting portion EA that actually emits light to the outside, and contact portions CA1 and CA2 that are electrically connected to the outside through contact electrodes 127 and 175 to apply a signal to the lighting portion EA.

The contact portions CA1 and CA2 are not covered by encapsulating means of a metal film 170 and thus may be electrically connected to the outside through the contact electrodes 127 and 175.

At this time, the contact portions CA1 and CA2 are located outside the lighting portion EA. The second contact portion CA2 is located along an outer periphery of the lighting portion EA, and the first contact portion CA1 is located outside the second contact portion CA2. Therefore, the metal film 170 may be attached to the entire surface of the lighting portion EA of the substrate 110 except for the contact portions CA1 and CA2.

Accordingly, the first contact portion CA1 may be located along the outer periphery of the second contact portion CA2, and the first contact electrode 127 may be provided at an arbitrary position of the first contact portion CA1. The second contact electrode 175 may be provided on side surfaces of the metal film 170 and an adhesive 118 along the outer periphery of the metal film 170.

A first electrode 116 and a second electrode 126 may be disposed on the substrate 110 and an organic light emitting layer 130 is interposed between the first electrode 116 and the second electrode 126, thereby implementing the organic light emitting diode. In the lighting apparatus 100 having such a structure, as a signal is applied to the first electrode 116 and the second electrode 126 of the organic light emitting diode, the organic light emitting layer 130 emits light to be output through the lighting portion EA.

The organic light emitting layer 130 may be a light emitting layer that outputs white light. For example, the organic light emitting layer 130 may also include a blue light emitting layer, a red light emitting layer, a green light emitting layer, or may have a tandem structure including a blue light emitting layer and a yellow-green light emitting layer. However, the organic light emitting layer 130 of the present disclosure is not limited to the above-described structure, and may employ various structures.

The organic light emitting layer 130 according to the present disclosure may further include an electron injection layer and a hole injection layer for injecting electrons and holes, respectively, into the light emitting layer, an electron transport layer and a hole transport layer for transporting the injected electrons and holes to the light emitting layer, and a charge generation layer for generating charges, such as the electrons and holes.

At this time, the second contact portion CA2 located outside the lighting portion EA may be provided with a trench T that is formed by removing the organic light emitting layer 130, the second electrode 126 and second and third passivation layers 115b and 115c so as to expose a first passivation layer 115a. At this time, the trench T is formed to surround the lighting portion EA and serves to prevent moisture from being introduced into the organic light emitting layer 130 of the lighting portion EA. Generally, when a polymer constituting the organic light emitting material is combined with moisture, light emission characteristics are rapidly deteriorated, and thereby the light emission efficiency of the organic light emitting layer 130 is lowered. Specifically, when the organic light emitting layer 130 of the lighting apparatus 100 is partially exposed to the outside, moisture is introduced into the lighting apparatus 100 along the organic light emitting layer 130 to lower the light emission efficiency of the lighting apparatus 100. In the present disclosure, the trench T is formed on the entire outer periphery of the lighting portion EA. This results in preventing moisture from being introduced into the organic light emitting layer 130 of the lighting portion EA of the lighting apparatus 100, through which light is actually output.

In this instance, referring to FIG. 2, the trench T may have a shape of a rectangular frame as a whole, but the present disclosure is not limited to this.

The organic light emitting layer 130 is disconnected by the trench T along the outer periphery of the lighting portion EA, and thus moisture can be prevented from being introduced into the lighting portion EA along the organic light emitting layer 130. In particular, the trench T may be formed through laser ablation without a photolithography process. This may result in simplifying a fabricating process.

At this time, the first electrode 116 is disposed on the substrate 110 made of a transparent material. A rigid material such as glass may be used as the substrate 110, but the substrate 110 may be made of a material having flexibility, which may allow a fabrication of the lighting apparatus 100 that is bendable or curvable. Also, in the present disclosure, with use of a plastic material having flexibility as the substrate 110, a process using a roll is allowed, and thus the lighting apparatus 100 can be fast fabricated.

The first electrode 116 may be formed on the lighting portion EA and the first and second contact portions CA1 and CA2 and made of a transparent conductive material having high conductivity and work function. For example, in the present disclosure, the first electrode 116 may be made of a tin oxide-based conductive material such as indium tin oxide (ITO) or a zinc oxide-based conductive material of indium zinc oxide (IZO). A transparent conductive polymer may also be used as the first electrode 116.

An auxiliary electrode 111 may be disposed on the lighting portion EA and the first contact portion CA1 of the substrate 110 to be electrically connected to the first electrode 116. The first electrode 116 is made of the transparent conductive material and thus has an advantage of transmitting emitted light. However, the first electrode 116 has a disadvantage of having very high electric resistance as compared with an opaque metal. Therefore, when the large lighting apparatus 100 is fabricated, currents applied to a wide light emitting area are unevenly distributed due to the high resistance of the transparent conductive material, and the uneven current distribution prevents the large lighting apparatus 100 from emitting light with uniform luminance.

The auxiliary electrode 111 is arranged in a form of a thin matrix, a mesh, a hexagon, an octagon, a circle, or the like throughout the entire lighting portion EA. This allows the current to be evenly applied to the first electrode 116 of the entire lighting portion EA, thereby enabling the lighting apparatus 100 to emit light with uniform luminance.

FIG. 3 illustrates that the auxiliary electrode 111 is disposed on a lower portion of the first electrode 116. However, the present disclosure is not limited thereto, and the auxiliary electrode 111 may alternatively be disposed on an upper portion of the first electrode 116. The auxiliary electrode 111 disposed on the first contact portion CA1 is used as a path for transferring the current toward the first electrode 116 through the first contact electrode 127. However, the auxiliary electrode 111 may also serve as a contact electrode which is brought into contact with an outside to apply an external current to the first electrode 116. In this instance, the example in which the first electrode 116 extends to the first contact portion CA1 of the substrate 110 to constitute the first contact electrode 127, but the present disclosure is not limited thereto.

The auxiliary electrode 111 may be made of a metal having good electrical conductivity such as Al, Au, Cu, Ti, W, Mo, or an alloy thereof. The auxiliary electrode 111 may have a two-layered structure including an upper auxiliary electrode 111a and a lower auxiliary electrode 111b. However, the present disclosure is not limited thereto and the auxiliary electrode 111 may be configured as a single layer.

The first passivation layer 115a may be laminated on parts of the lighting portion EA and the first and second contact portions CA1 and CA2 of the substrate 110. In FIG. 2, the first passivation layer 115a is formed in a shape of a rectangular frame having a predetermined width, but the present disclosure is not limited thereto.

The first passivation layer 115a disposed on the lighting portion EA is to cover the auxiliary electrode 111 and the first electrode 116 on the auxiliary electrode 111. However, the first passivation layer 115a is not disposed on a light emitting area from which light is actually emitted. In particular, the first passivation layer 115a of the lighting portion EA is formed to surround the auxiliary electrode 111 to reduce a stepped portion (or step coverage) caused by the auxiliary electrode 111, so that various layers to be formed later can be formed stably without being disconnected.

The first passivation layer 115a may be made of an inorganic material such as $SiO_x$ or $SiN_x$. However, the first passivation layer 115a may be made of an organic material such as photoacryl, or may be made of a plurality of layers of an inorganic material and an organic material.

In this instance, the lighting apparatus 100 using the organic light emitting diode according to the exemplary aspect of the present disclosure includes the organic light emitting layer 130, the second electrode 126 and the second and third passivation layers 115b and 115c disposed on the entire upper surface of the substrate 110 on which the first electrode 116 and the first passivation layer 115a are disposed.

That is, in the lighting apparatus 100 using the organic light emitting diode according to the aspect of the present disclosure, the organic light emitting layer 130, the second electrode 126 and the second and third passivation layers 115b and 115c are all deposited on the entire surface of the substrate 110 without an open mask, which is a separate sophisticated apparatus, and then encapsulated by a metal film. Afterwards, the resultant is patterned using laser ablation to form the contact electrodes 127 and 175.

At this time, portions of the organic light emitting layer 130, the second electrode 126 and the second and third passivation layers 115b and 115c which are disposed on the second contact portion CA2 of the substrate 110 are removed through the laser ablation to form a trench T. In this instance, a surface of the first passivation layer 115a may be exposed through the trench T.

The organic light emitting layer 130, the second electrode 126 and the second and third passivation layers 115b and 115c which are disposed on the first contact portion CA1 of the substrate 110 are removed through the laser ablation to form a contact hole 114 exposing a portion of the first contact electrode 127 therethrough.

A non-conductive protection film 174, such as a barrier tape, may be attached or a passivation layer may be laminated within the contact hole 114. That is, the protection film 174 may formed to cover a side surface within the contact hole 114 (i.e., side surfaces of the organic light emitting layer 130, the second electrode 126 and the second and third passivation layers 115b and 115c within the contact hole 114), and thus serve to prevent moisture permeation or introduction together with the trench T. As described above, the present disclosure provides an effect of improving reliability by preventing the moisture permeation in the manner of covering the exposed side surface of the contact hole 114 using the protection film 174.

The present disclosure is also characterized in that the second contact electrode 175 is formed on side surfaces of the metal film 170 and the adhesive 118 along an outer periphery of the metal film 170 through a silver printing process. At this time, the second contact electrode 175 may also be filled even in the trench T. However, the present disclosure is not limited to the printing process, and may alternatively employ various methods such as screen printing and inkjet printing.

As such, the first contact electrode 127 may be formed by the first electrode 116 or an additional electrode (not shown), and the second contact electrode 175 may allow for a cathode contact, the protection of the side surfaces of the encapsulating member (i.e., the metal film 170 and the adhesive 118), and the prevention of the moisture permeation through the trench T.

In addition, since the laser processing (i.e., laser ablation) proceeds after encapsulation with the metal film 170, a defect issue due to particles generated during the laser ablation can fundamentally be prevented. That is, in case where the laser processing is performed before the encapsulation, a defect is likely to be caused due to particles, which are scattered while processing upper surfaces of the organic light emitting layer 130 and the second electrode 126. However, a deposition process or a lamination process is not followed after the encapsulation process, and thus such a defect due to the particles may not be caused even though the particles are generated. Also, the contact portions CA1 and CA2 where moisture is likely to be introduced are additionally protected by being covered with the protection film 174 and the second contact electrode 175, thereby ensuring reliability.

At this time, in case of using the conventional open mask, different open masks must be applied to the organic light emitting layer 130, the second electrode 126 and the second and third passivation layers 115b and 115c, respectively. Accordingly, sophisticated masks and apparatuses should be fabricated. Moreover, in roll-to-roll processing, continuous feeding should be done roll-to-sheet in one-pass rather than in individual sheets. Thus, complicated line equipment is required, and it is difficult to achieve precision.

Therefore, according to the present disclosure which does not use the open mask, a fabrication cost can be reduced. Simultaneously, processes and apparatuses can be simplified, and thus various models can be produced without an additional cost. In addition, the organic light emitting diode can be patterned merely by a simple apparatus without an open mask and the like, thereby fabricating the lighting apparatus effectively using a roll-to-roll process.

That is, the present disclosure can form fine patterns without applying sophisticated masks and apparatuses even for the roll-to-roll process as well as a glass process. In addition, conventionally, an open mask having a different shape has been fabricated and applied for each shape of a product. However, for using a laser, only design information related to the laser can be merely changed and input to an apparatus, without a change or fabrication of a separate open mask. Thus, this method can be simply applied to various types of products.

As described above, the organic light emitting layer 130, which is the white organic light emitting layer, may include the red light emitting layer, the blue light emitting layer, and the green light emitting layer, or have a tandem structure including the blue light emitting layer and the yellow-green light emitting layer. The organic light emitting layer 130 may include an electron injection layer and a hole injection layer for injecting electrons and holes respectively into the light emitting layer, an electron transport layer and a hole transport layer for transporting the injected electrons and holes to the light emitting layer, and a charge generation layer for generating charges such as the electrons and the holes.

The second electrode 126 may be made of a metal such as Al, Mo, Cu or Ag, or an alloy such as MoTi.

The first electrode 116, the organic light emitting layer 130, and the second electrode 126 of the lighting portion EA constitute an organic light emitting diode. In this instance, the first electrode 116 is an anode of the organic light emitting diode and the second electrode 126 is a cathode. When currents are applied to the first electrode 116 and the second electrode 126, electrons are injected from the second electrode 126 into the organic light emitting layer 130 and holes are injected from the first electrode 116 into the organic light emitting layer 130. Afterwards, excitons are generated in the organic light emitting layer 130. As the excitons are decayed, light corresponding to an energy difference between Lowest Unoccupied Molecular Orbital (LUMO) and Highest Occupied Molecular Orbital (HOMO) of the light emitting layer is generated and emitted downward (toward the substrate 110 in the drawing).

At this time, since the first passivation layer 115a is disposed on the auxiliary electrode 111 of the lighting portion EA, the organic light emitting layer 130 on the auxiliary electrode 111 is not directly brought into contact with the first electrode 116, and thus the organic light emitting diode is not formed on the auxiliary electrode 111. That is, the organic light emitting diode within the lighting portion EA, for example, is formed only within the light emitting area in the auxiliary electrode 111 formed in a matrix configuration.

The trench T described above is formed at the second contact portion CA2 of the substrate 110 to disconnect the organic light emitting layer 130 in the lighting portion EA from the organic light emitting layer 130 of the contact portions CA1 and CA2. As such, according to the present disclosure, as the organic light emitting layer 130 in the lighting portion EA and the organic light emitting layer 130 in the contact portions CA1 and CA2 are disconnected from each other by the trench T, moisture which permeates from an external area of the organic light emitting layer 130 can be prevented from being introduced into the organic light emitting layer 130 of the lighting portion EA, from which light is actually emitted. Further, in the present disclosure, the organic light emitting layer 130 is disconnected through the laser ablation without an addition of an open mask or a photolithography process, thereby preventing an addition of a fabrication process and a thusly-caused cost increase.

In this instance, since the second electrode 126 is also disposed on the organic light emitting layer 130 of the lighting portion EA and on the organic light emitting layer 130 of the contact portions CA1 and CA2, the second electrode 126 of the lighting portion EA is disconnected from the second electrode 126 of the contact portions CA1 and CA2.

The second passivation layer 115b and the third passivation layer 115c may be provided on the entire surface of the substrate 110 on which the second electrode 126 is formed.

The second passivation layer 115b may be made of an organic material such as photoacryl. In addition, the third passivation layer 115c may be made of an inorganic material such as $SiO_x$ or $SiN_x$. However, the present disclosure is not limited thereto.

A predetermined encapsulant may be additionally provided on the third passivation layer 115c. The encapsulant may be an epoxy compound, an acrylate compound, an acrylic compound, or the like.

As aforementioned, the contact hole 114 is formed on the first contact portion CA1 of the substrate 110 by removing the organic light emitting layer 130, the second electrode 126 and the second and third passivation layers 115b and 115c. The first contact electrode 127 connected to the first electrode 116 may be externally exposed through the contact hole 114. The second contact electrode 175 is formed along the outer periphery of the metal film 170, and as aforementioned, is also formed within the trench T to be electrically connected to the second electrode 126. Accordingly, the first contact electrode 127 and the second contact electrode 175 are electrically connected to an external power source such that currents can be applied to the first electrode 116 and the second electrode 126.

The adhesive 118 such as pressure sensitive adhesive (PSA) is coated on the third passivation layer 115c, and the metal film 170 is disposed on the adhesive 118. Accordingly, the metal film 170 is attached to the third passivation layer 115c to encapsulate the lighting apparatus 100.

The adhesive 118 may be a photocurable adhesive or a thermosetting adhesive.

As described above, the organic light emitting layer 130 is laminated on the entire surface of the substrate 110, and encapsulated with the metal film. Afterwards, the trench T is formed by the laser ablation to disconnect the organic light emitting layer 130. This may result in preventing moisture from permeating into the organic light emitting layer 130 of the lighting portion EA. Since the laser processing is performed after the encapsulation, a defect issue due to particles generated during the laser processing can be fundamentally prevented.

In addition, since the substrate 110 made of the plastic film having flexibility is used and simultaneously the organic light emitting layer 130, the second electrode 126, and the second and third passivation layers 115b and 115c are laminated on the entire surface of the substrate 110, a fabrication using a roll may be allowed. This may result in a fast fabrication of the lighting apparatus 100 and a reduction of a fabrication cost.

Figure 4:
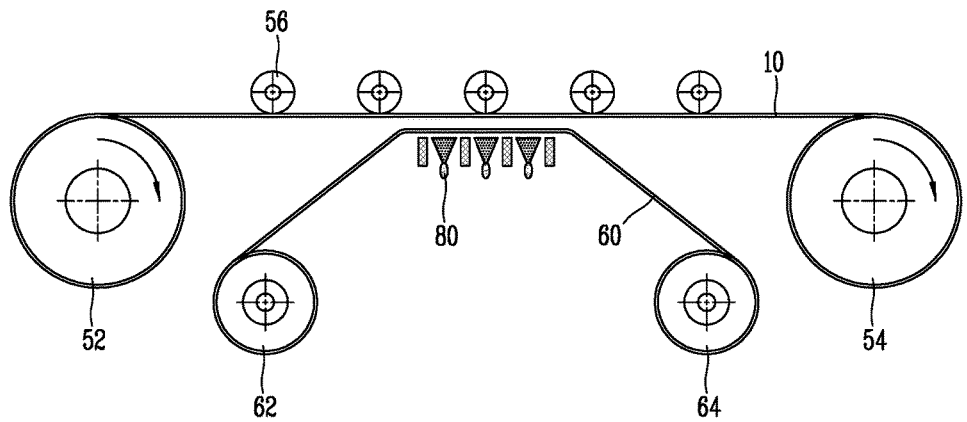
FIG. 4 is a cross-sectional view illustrating a concept of a roll-to-roll apparatus.

FIG. 4 is a cross-sectional view exemplarily illustrating a concept of a roll-to-roll apparatus, namely, illustrates a concept of the roll-to-roll apparatus for fabricating a flexible lighting apparatus.

As illustrated in FIG. 4, the roll-to-roll apparatus for fabricating the flexible lighting apparatus includes a film supply roll 52 for supplying a plastic film 10, a film recovery roll 54 for recovering the plastic film 10, and guide rolls 56 for guiding the plastic film 10.

The roll-to-roll apparatus also includes a mask supply roll 62 for supplying an open mask 60 (or a metal mask), a mask recovery roll 64 for recovering the open mask 60, and a deposition device 80 for depositing an organic material or a metal layer.

In the roll-to-roll apparatus having this configuration, the plastic film 10 used as a substrate of the lighting apparatus is transferred from the film supply roll 52 to the deposition device 80, and simultaneously the open mask 60 is transferred from the mask supply roll 62 to the deposition device 80, such that the open mask 60 is disposed on a front surface of the plastic film 10. In this state, an organic film or a metal is deposited on a partial area of the plastic film 10 by the deposition apparatus 80.

After completion of the deposition, the open mask 60 is separated from the plastic film 10. The plastic film 10 is recovered by the film recovery roll 54 and the open mask 60 is recovered by the mask recovery roll 64.

In case of using the roll-to-roll apparatus having such structure, the plastic film 10 can be continuously supplied by the film supply roll 52 to allow a continuous process, thereby enabling a fast fabrication of the lighting apparatus. However, the roll-to-roll apparatus may cause the following problems.

The roll-to-roll apparatus may be used to form various metal patterns, but may be effectively used specifically for forming the organic light emitting layer or the second electrode. In other words, the organic light emitting layer or the second electrode is deposited on the entire area of the substrate, other than being patterned on a predetermined area through a photolithography process, and thus can be easily formed through the roll-to-roll process.

However, when the organic light emitting layer is formed by depositing an organic light emitting material on the entire surface of the substrate by the roll-to-roll apparatus, the side surface of the organic light emitting layer deposited on the entire surface of the substrate is formed at the same level as the side surface of the substrate, and thus the organic light emitting layer is externally exposed through a side surface of the lighting apparatus. The organic light emitting material is vulnerable to moisture. When the organic light emitting material is combined with moisture, the light emitting material is drastically deteriorated and facilitates permeation of the moisture. Therefore, in order to prevent a production of a defective lighting apparatus due to the permeation of moisture through the externally-exposed light emitting layer, the organic light emitting layer should not be externally exposed when fabricating the lighting apparatus.

Accordingly, since the open mask blocks an outer area of the substrate, the organic light emitting layer is not deposited on the outer area of the substrate when depositing the organic light emitting material. And the outer area is encapsulated using an encapsulant or an adhesive so as to seal the side surface of the organic light emitting layer, thereby preventing an external exposure of the organic light emitting layer.

However, as illustrated in FIG. 4, when the organic light emitting layer is formed using the open mask 60, a system for supplying the plastic film 10 (for example, a supply roll, a guide roll, a recovery roll, etc.) and a system for supplying the open mask 60 should be in an in-line manner. Such a disadvantage can cause an extension of a process line and even a length of the open mask 60. Also, the plastic film 10 and the open mask 60 should be supplied in a synchronizing manner and aligned during a consecutive process. Further, the used open mask 60 should be washed. However, it is difficult to wash such long open mask 60.

In other words, the roll-to-roll process using the open mask should be used for fast fabricating the lighting apparatus. However, the use of the open mask actually causes a practical difficulty in fabricating the lighting device using the roll-to-roll apparatus.

However, in the present disclosure, the trench is formed by removing the organic light emitting layer of the second contact portion of the substrate through the laser ablation. Accordingly, the organic light emitting layer is disconnected by the trench even when the side surface of the organic light emitting layer is exposed to the outside by depositing the organic light emitting material on the entire surface of the substrate, and thus moisture permeation (or introduction) into the lighting portion through the exposed organic light emitting layer can be prevented. Therefore, the lighting apparatus according to the present disclosure can be fabricated without the open mask, which may result in simplifying the fabricating process of the lighting apparatus and specifically, fabricating the lighting apparatus easily using the roll-to-roll process.

Hereinafter, a lighting apparatus and a method of fabricating a lighting apparatus with a general structure through a roll process according to an aspect of the present disclosure will be described, to help understanding advantages of a fabricating process of the lighting apparatus according to the aspect of the present disclosure.

Figure 5:
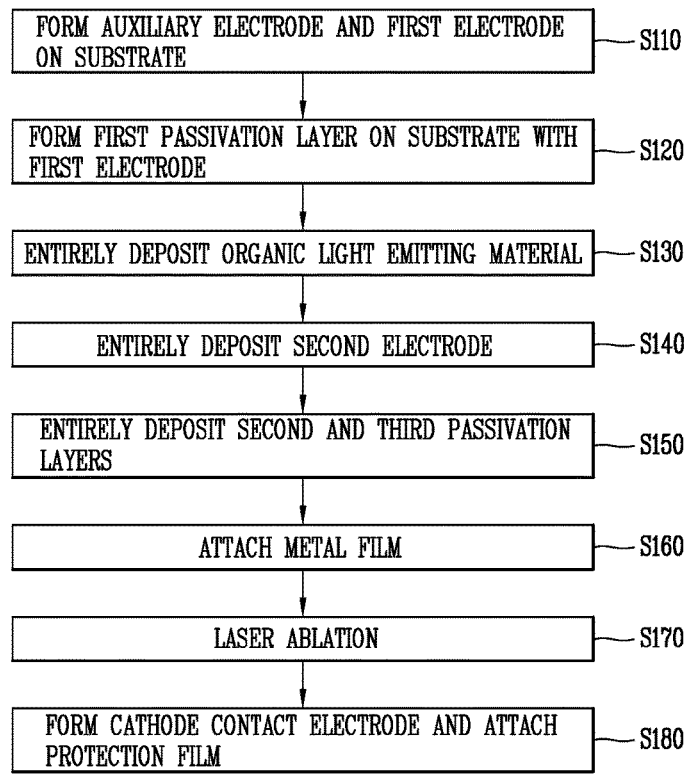
FIG. 5 is a flowchart sequentially illustrating a method of fabricating a lighting apparatus using an organic light emitting diode in accordance with an aspect of the present disclosure.

FIG. 5 is a flowchart sequentially illustrating a method of fabricating a lighting apparatus using an organic light emitting diode according to an aspect of the present disclosure.

Referring to FIG. 5, first, an auxiliary electrode and a first electrode are formed on a substrate made of a transparent plastic film having flexibility (S110). Afterwards, an inorganic material is laminated and etched to form a first passivation layer (S120). At this time, the auxiliary electrode, the first electrode, and the first passivation layer may be formed through a photolithography process using a photoresist and a photomask in a roll-to-roll apparatus.

Then, an organic light emitting material is deposited on the entire surface of the substrate using the roll-to-roll apparatus illustrated in FIG. 4 to form an organic light emitting layer (S130). In the present disclosure, since an open mask is not required in depositing the organic light emitting material, the open mask, a mask supply roll, and a mask recovery roll are not required in the roll-to-roll apparatus illustrated in FIG. 4.

Thereafter, a metal is deposited on the entire surface of the substrate to form a second electrode (S140), and then second and third passivation layers are deposited on the entire surface of the substrate (S150).

Subsequently, a metal film is attached by an adhesive (S160), and the organic light emitting layer, the second electrode and the second and third passivation layers are removed through laser ablation to form a predetermined trench within the second contact portion of the substrate and simultaneously a contact hole is formed within the first contact portion (S170).

Afterwards, a second contact electrode is formed in the second contact portion to encapsulate a side surface of a metal film including an inside of the trench, and simultaneously electrically connected to the second electrode. Further, a protection film is attached to a side surface of the contact hole of the first contact portion (S180).

Figure 6:
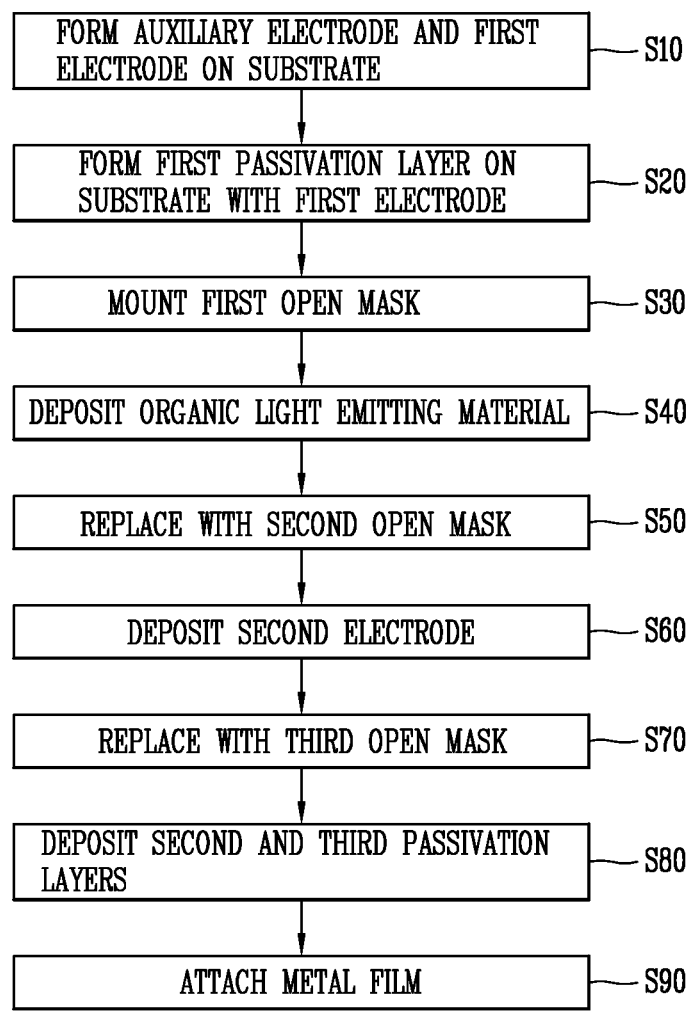
FIG. 6 is a flowchart sequentially illustrating a method of fabricating a lighting apparatus using an organic light emitting diode according to the comparative example.

FIG. 6 is a flowchart sequentially illustrating a method of fabricating a lighting apparatus using an organic light emitting diode according to the comparative example.

Referring to FIG. 6, first, an auxiliary electrode and a first electrode are formed on a substrate made of a transparent plastic film having flexibility (S10), and an inorganic material is laminated and etched to form a first passivation layer (S20).

Subsequently, an organic light emitting material is deposited on the entire surface of the substrate in a state that a first open mask (metal mask) is mounted on the substrate, to form an organic light emitting layer (S30 and S40).

Thereafter, in a state that the first open mask mounted on the entire surface of the substrate is replaced with a new second open mask, a metal is deposited to form a second electrode (S50 and S60).

Then, in a state that the second open mask mounted on the entire surface of the substrate is replaced with a new third open mask, second and third passivation layers are formed (S70 and S80).

Thereafter, a metal film is attached by an adhesive so as to completely fabricate a lighting apparatus (S90).

As described above, since the open mask is not required when fabricating the lighting apparatus using the roll-to-roll apparatus, the processes of mounting the open mask and replacing the open mask are not required as compared with the lighting apparatus according to the comparative example. Therefore, the lighting apparatus according to the aspect of the present disclosure can be fabricated fast.

Further, for the lighting apparatus according to the comparative example, after completion of the process for the plastic film provided on a supply roll, when performing a process again by supplying the plastic film again on the supply roll, the open mask used in the previous process must be washed. On the other hand, for the fabrication of the lighting apparatus according to the aspect of the present disclosure, the washing of the open mask is not required.

Therefore, a separate washing device is not required when fabricating the lighting apparatus according to the aspect of the present disclosure. This may result in a reduction of a fabricating cost and a prevention of an environmental contamination due to the washing process. In addition, the washing process is not required between a deposition process and a subsequent deposition process, thereby enabling faster fabrication process.

Moreover, for the lighting apparatus according to the comparative example, a separate device for disposing the open mask on the front surface of the substrate is required. On the other hand, such device is not necessary in the aspect of the present disclosure, which may result in simplifying a fabricating apparatus and reducing a fabricating cost.

FIGS. 7A to 7F are planar views sequentially illustrating a method of fabricating the lighting apparatus using the organic light emitting diode according to the aspect of the present disclosure illustrated in FIG. 2.

Figure 7A:
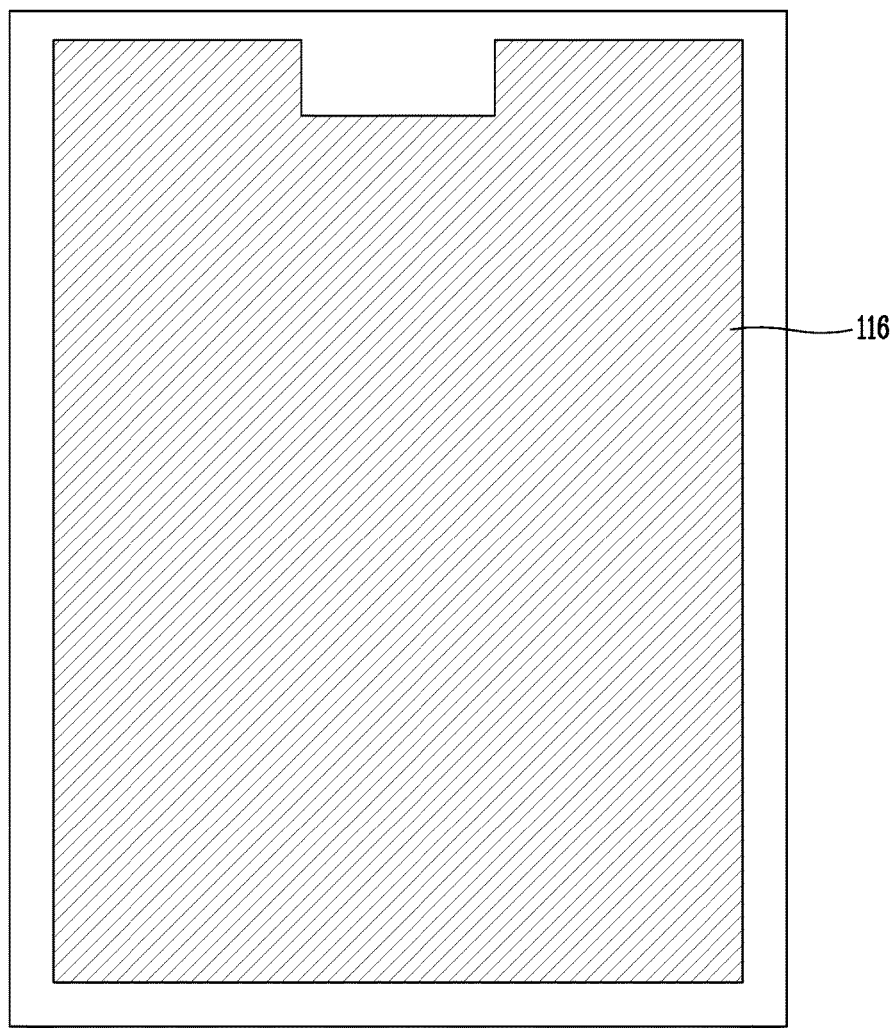
FIGS. 7A to 7F are planar views sequentially illustrating a method of fabricating the lighting apparatus using the organic light emitting diode illustrated in FIG. 2.
Figure 7B:
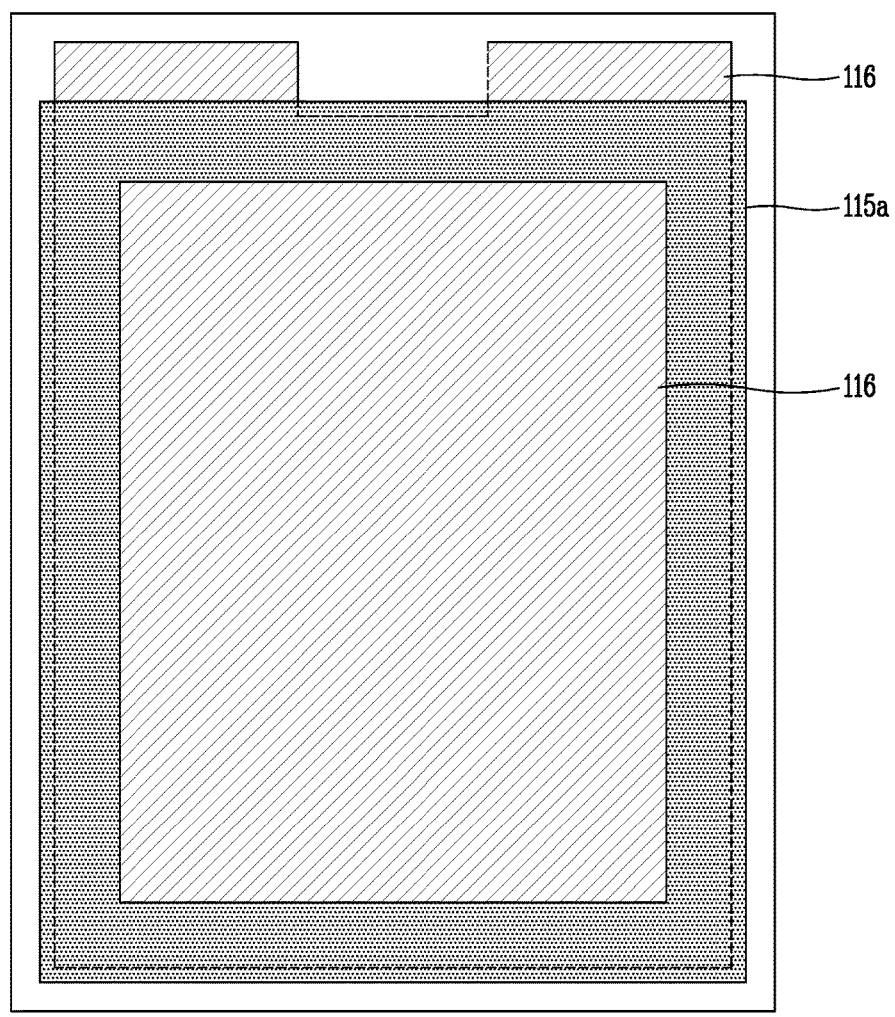
Figure 8:
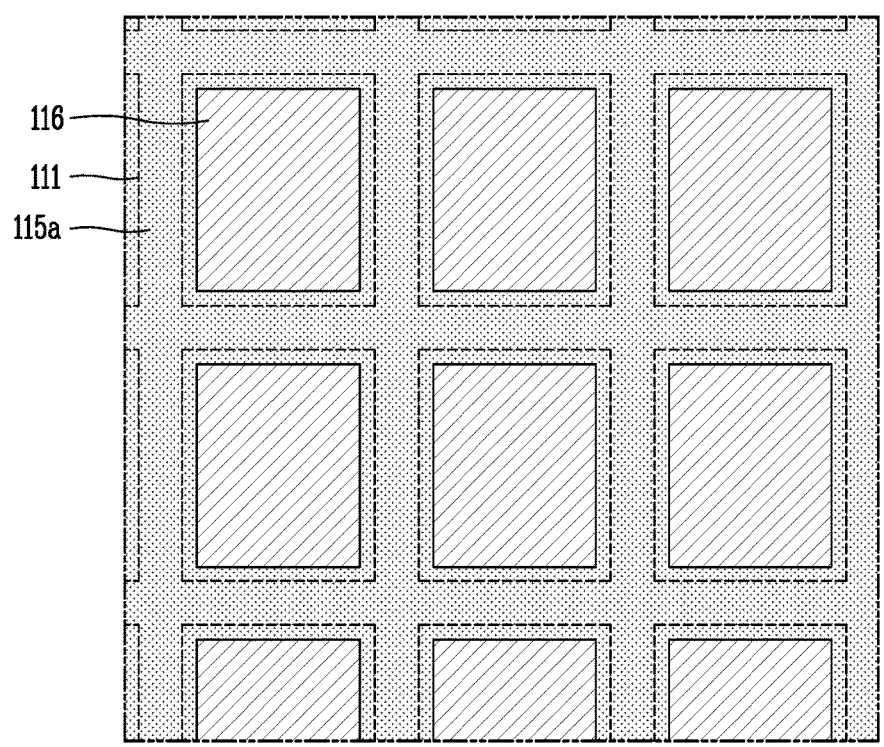
FIG. 8 is an enlarged view of a part of the lighting portion illustrated in FIG. 7B.

FIG. 8 is an enlarged view of a part of the lighting portion illustrated in FIG. 7B.

And, FIGS. 9A to 9F are cross-sectional views sequentially illustrating a method of fabricating the lighting apparatus using the organic light emitting diode according to the aspect of the present disclosure illustrated in FIG. 3.

At this time, although the fabricating method is exemplarily illustrated as a process performed in the roll-to-roll apparatus, the present disclosure is not limited thereto, and may be similarly applied to a general fabricating apparatus using a substrate such as glass.

Figure 9A:
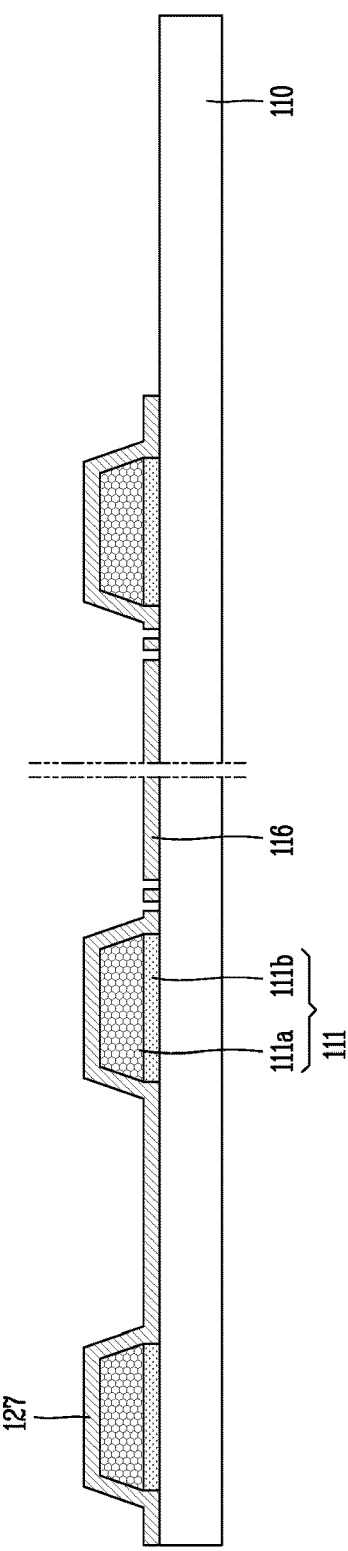
FIGS. 9A to 9F are cross-sectional views sequentially illustrating a method of fabricating the lighting apparatus using the organic light emitting diode illustrated in FIG. 3.

As illustrated in FIGS. 7A and 9A, a metal such as Al, Au, Cu, Ti, W, Mo, or an alloy thereof is laminated on the substrate 110 having the lighting portion and the contact portions and then etched, thereby forming an auxiliary electrode 111 made of a single layer or a plurality of layers on the lighting portion and the first contact portion.

In this instance, FIGS. 7A and 9A illustrate an example in which the auxiliary electrode 111 is formed in a two-layered structure including an upper auxiliary electrode 111a and a lower auxiliary electrode 111b. However, the present disclosure is not limited thereto.

At this time, the auxiliary electrode 111 may be arranged in a thin matrix shape (as shown in FIG. 8), a mesh shape, a hexagonal shape, an octagonal shape, or a circular shape throughout the entire lighting portion EA.

Afterwards, a transparent conductive material such as ITO or IZO is deposited over the entire surface of the substrate 110 and etched, to form a first electrode 116 on the lighting portion and the first and second contact portions.

In this instance, FIGS. 7A and 9A illustrate that the auxiliary electrode 111 is formed on the lower portion of the first electrode 116. However, the present disclosure is not limited thereto, and the auxiliary electrode 111 may alternatively be formed on the upper portion of the first electrode 116. The auxiliary electrode 111 disposed on the first contact portion is used as a path for transferring current to the first electrode 116, but also serves as a contact electrode which is brought into contact with an outside for applying an external current to the first electrode 116.

In this case, the first electrode 116 extends to the first contact portion of the substrate 110 to form the first contact electrode 127, but the present disclosure is not limited thereto.

Figure 9B:
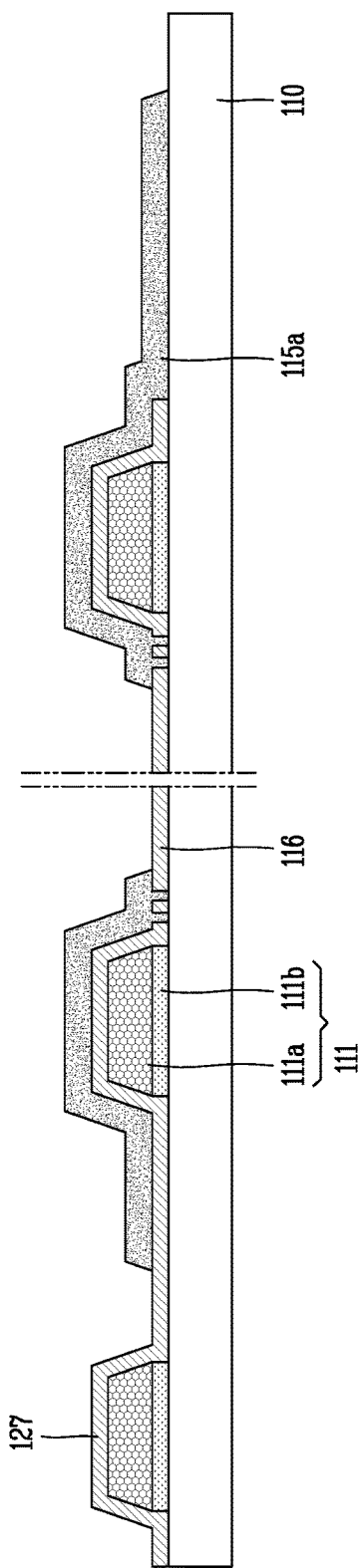

As illustrated in FIGS. 7B and 9B, an inorganic material such as $SiN_x$ or $SiO_x$ or an organic material such as photoacryl is laminated on parts of the lighting portion and the first and second contact portions of the substrate 110. Afterwards, the inorganic material or the organic material is etched to form the first passivation layer 115a on an upper portion and a side portion of the auxiliary electrode 111 of the lighting portion and on predetermined areas of the first and second contact portions.

In this instance, the first passivation layer 115a disposed on the lighting portion is formed to cover the auxiliary electrode 111 and the first electrode 116 on the auxiliary electrode 111, but is not formed on a light emitting area from which light is actually emitted (However, referring to FIG. 8, in the light emitting area, the first passivation layer 115a may actually be formed in a matrix form so as to cover the auxiliary electrode 111 arranged in the matrix form). In particular, the first passivation layer 115a of the lighting portion may be formed to surround the auxiliary electrode 111, so as to reduce a stepped portion by the auxiliary electrode 111. Accordingly, various layers to be formed later can be stably formed without being disconnected. The first passivation layer 115a is illustrated as a rectangular frame having a predetermined width in FIG. 7B, but the present disclosure is not limited thereto.

Figure 7C:
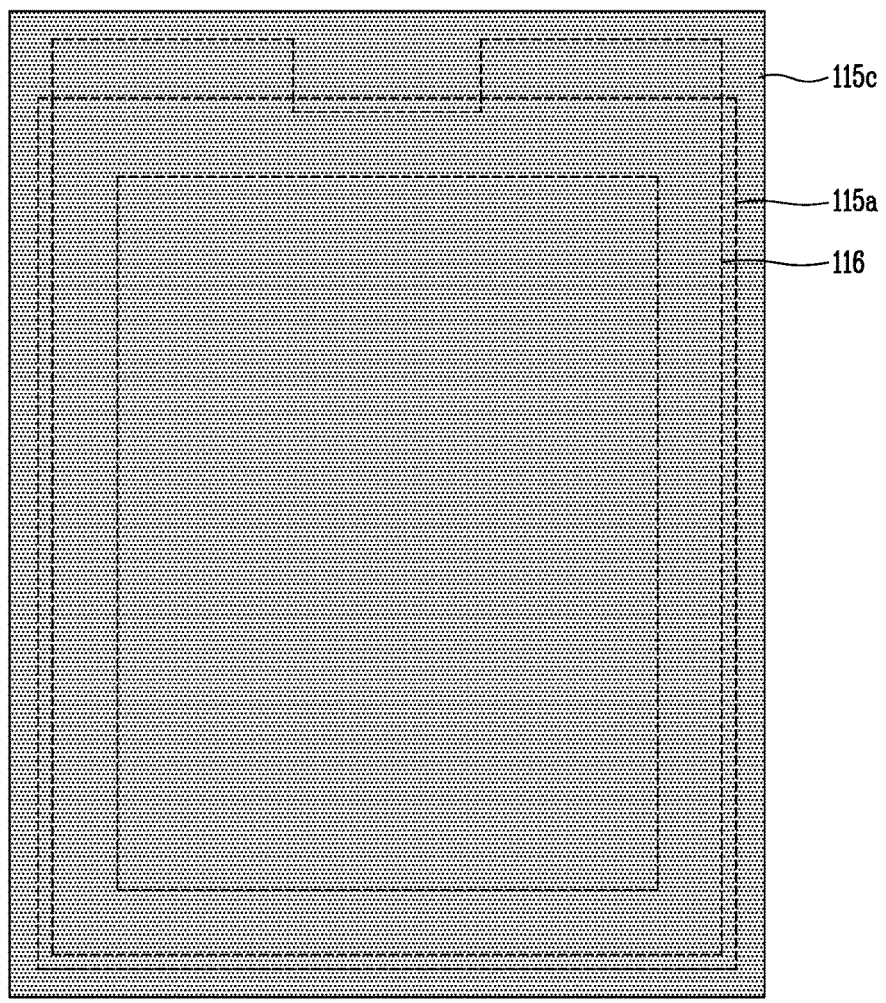
Figure 9C:
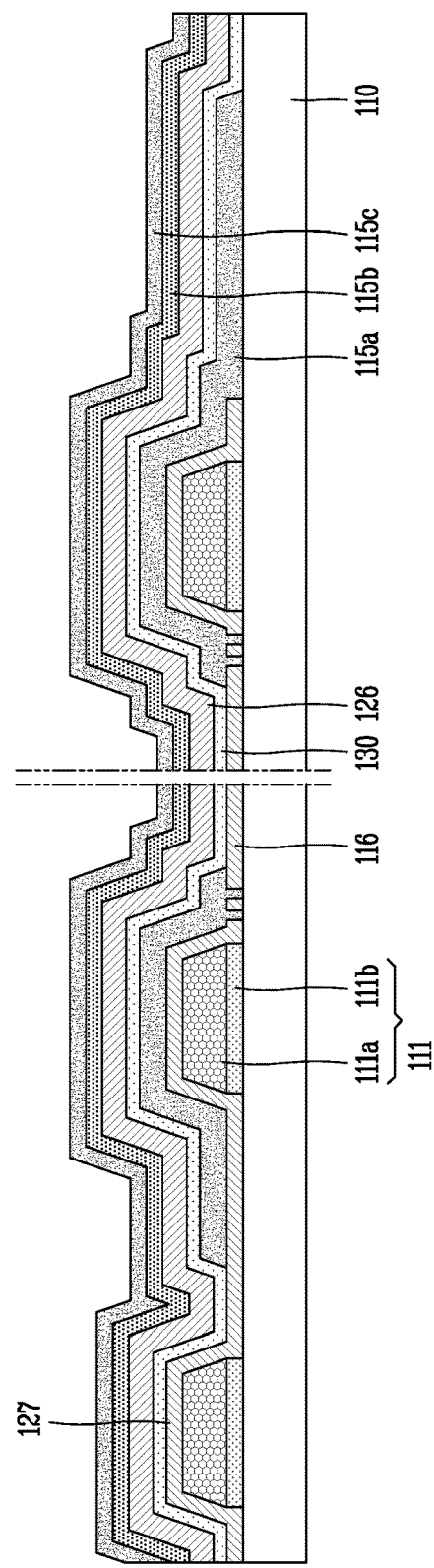

Referring to FIGS. 7C and 9C, an organic light emitting material, a metal, an organic insulating material and an inorganic insulating material are sequentially deposited on the entire surface of the substrate 110, to form the organic light emitting layer 130, the second electrode 126, the second passivation layer 115b and the third passivation layer 115c.

The organic light emitting layer 130 which is a white organic light emitting layer may include a red light emitting layer, a blue light emitting layer, and a green light emitting layer, or have a tandem structure including a blue light emitting layer and a yellow-green light emitting layer. Also, the organic light emitting layer 130 may include an electron injection layer and a hole injection layer for injecting electrons and holes respectively into the light emitting layer, an electron transport layer and a hole transport layer for transporting the injected electrons and holes to the light emitting layer, and a charge generation layer for generating charges such as the electrons and holes.

The second electrode 126 may be made of a metal such as Al, Mo, Cu, or Ag, or an alloy such as MoTi.

The first electrode 116, the organic light emitting layer 130, and the second electrode 126 of the lighting portion constitute an organic light emitting diode.

Since the first passivation layer 115a is disposed on the auxiliary electrode 111 of the lighting portion, the organic light emitting layer 130 on the auxiliary electrode 111 is not brought into contact directly with the first electrode 116, the organic light emitting diode is not formed on the auxiliary electrode 111. That is, the organic light emitting diode within the lighting portion, for example, is formed only in the light emitting area, which is partitioned by the auxiliary electrode 111 formed in the matrix form (as shown in FIG. 8).

As such, in the lighting apparatus using the organic light emitting diode according to the exemplary aspect of the present disclosure, the organic light emitting layer 130, the second electrode 126, and the second and third passivation layers 115b and 115c may be deposited on the entire surface of the substrate without any open mask as a separate sophisticated apparatus. Thus, a reduction of a cost and a simplification of processes and apparatuses may be achieved, thereby fabricating various models without an additional cost. In addition, the organic light emitting diode can be patterned merely with a simple apparatus without use of the open mask, and thus the lighting apparatus can be fabricated by effectively applying the roll-to-roll process.

Figure 7D:
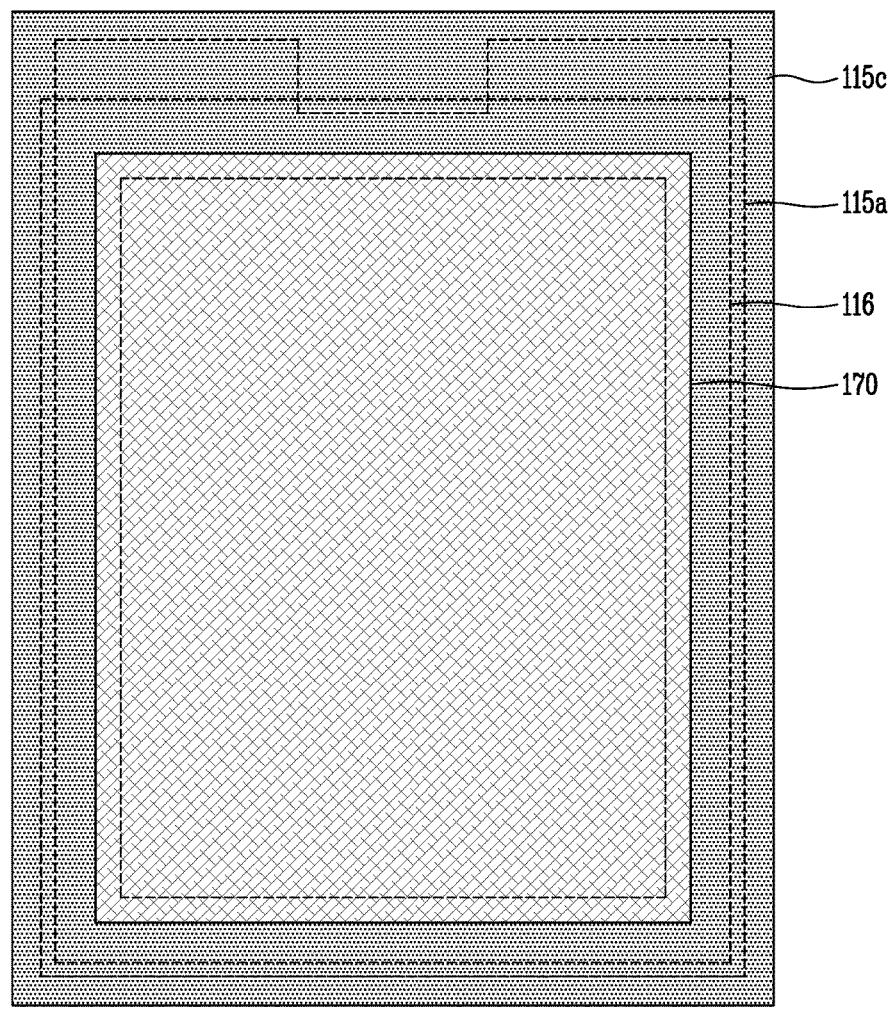
Figure 9D:
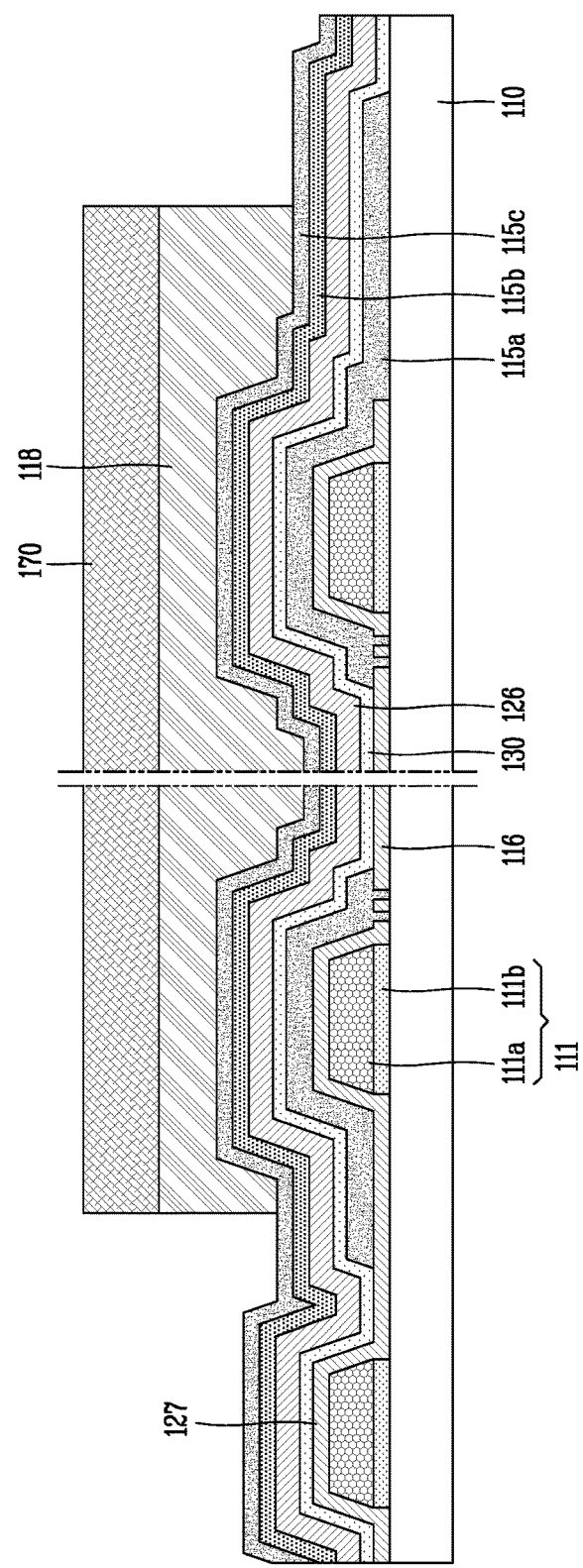

Afterwards, as illustrated in FIGS. 7D and 9D, the adhesive 118 made of the photocurable adhesive material or thermosetting adhesive material is coated onto the lighting portion of the substrate 110. Then, after the metal film 170 is placed on the adhesive 118, the metal film 170 is attached by curing the adhesive 118.

At this time, the first and second contact portions are not covered by the encapsulating means of the metal film 170, and thus can be electrically connected to an outside through the contact electrode to be formed later.

Figure 7E:
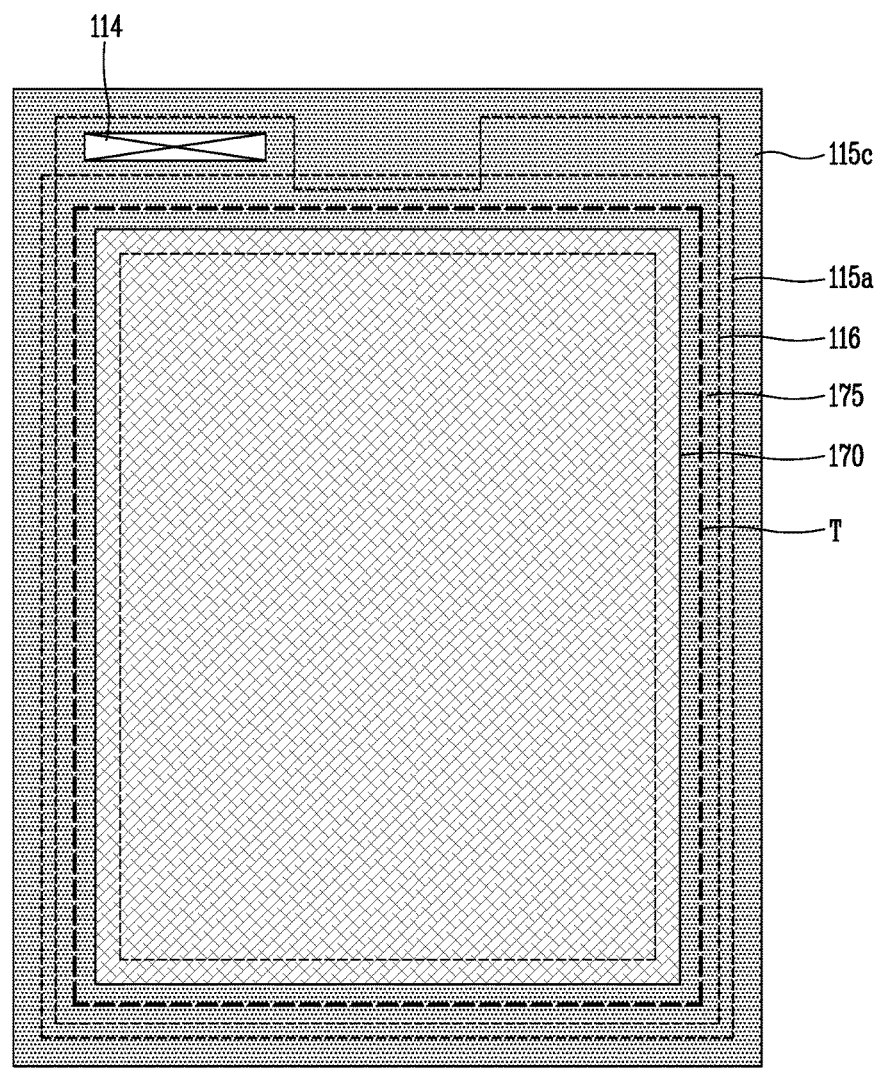
Figure 9E:
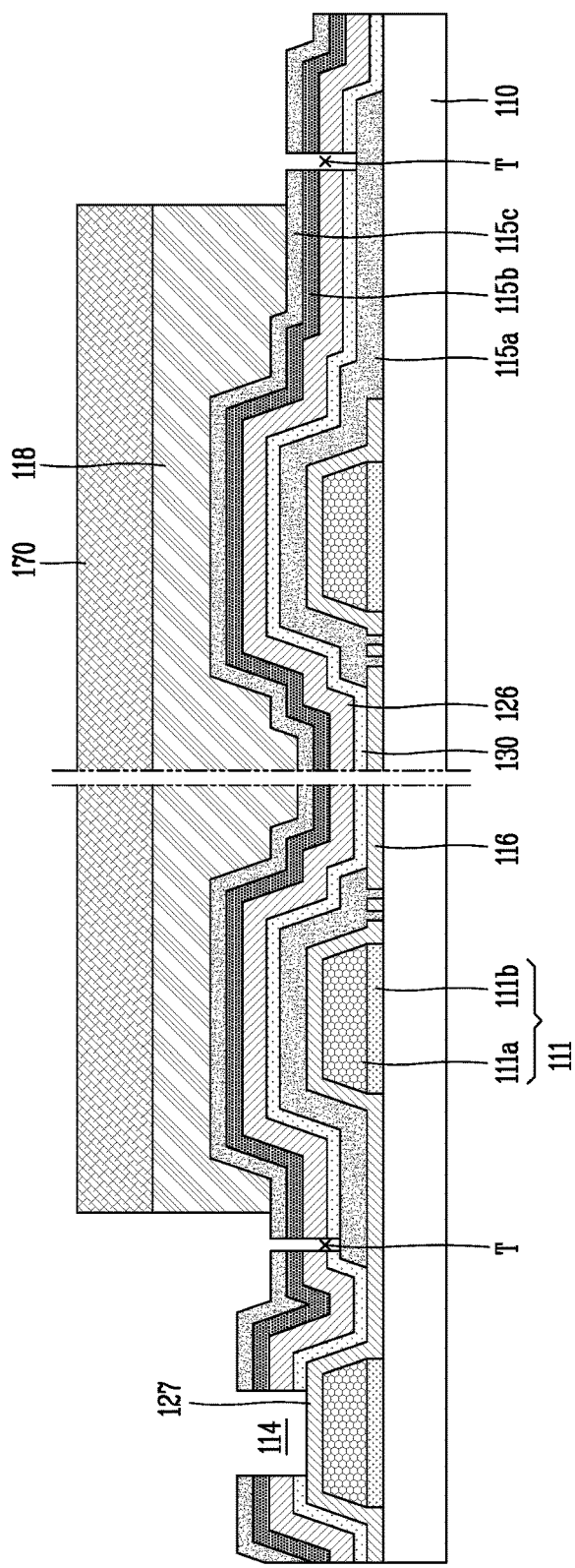

As illustrated in FIGS. 7E and 9E, partial areas of the organic light emitting layer 130, the second electrode 126, and the second and third passivation layers 115b and 115c deposited on the entire surface of the substrate are removed by laser ablation, thereby forming the trench T exposing the surface of the first passivation layer 115a located within the second contact portion of the substrate 110.

And, the contact hole 114 for exposing the first contact electrode 127 is formed by removing the organic light emitting layer 130, the second electrode 126 and the second and third passivation layers 115b and 115c of the first contact portion of the substrate 110 through the laser ablation.

At this time, the trench T may be formed on the outer area of the substrate 110 so that the organic light emitting layer 130 of the lighting portion and the organic light emitting layer 130 of the contact portion can be disconnected from each other. As described above, in the present disclosure, as the organic light emitting layer within the lighting portion and the organic light emitting layer 130 within the contact portion are disconnected from each other by the trench T, moisture which permeates from an outer area of the organic light emitting layer 130 can be prevented from being introduced into the organic light emitting layer 130 of the lighting portion, from which light is actually emitted, along the organic light emitting layer 130. In addition, in the present disclosure, the organic light emitting layer 130 is disconnected through the laser ablation without an addition of an open mask or a photolithography process, which may result in preventing an addition of a fabricating process and an increase in a fabricating cost.

As such, the trench T of the present disclosure may have a shape of a rectangular frame along the outer periphery of the lighting portion EA, but the present disclosure is not limited thereto.

In addition, since the laser processing (i.e., laser ablation) is performed after encapsulation with the metal film 170, a defect due to particles generated during the laser processing can be prevented.

Figure 7F:
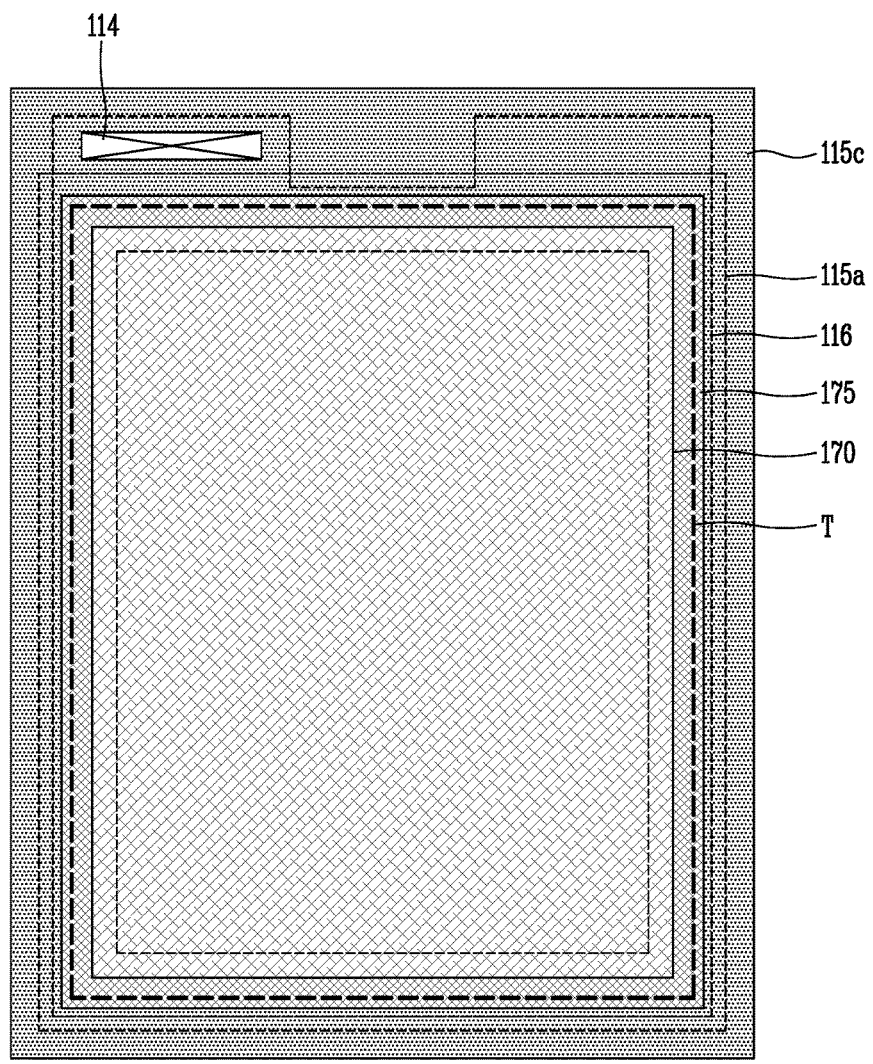
Figure 9F:
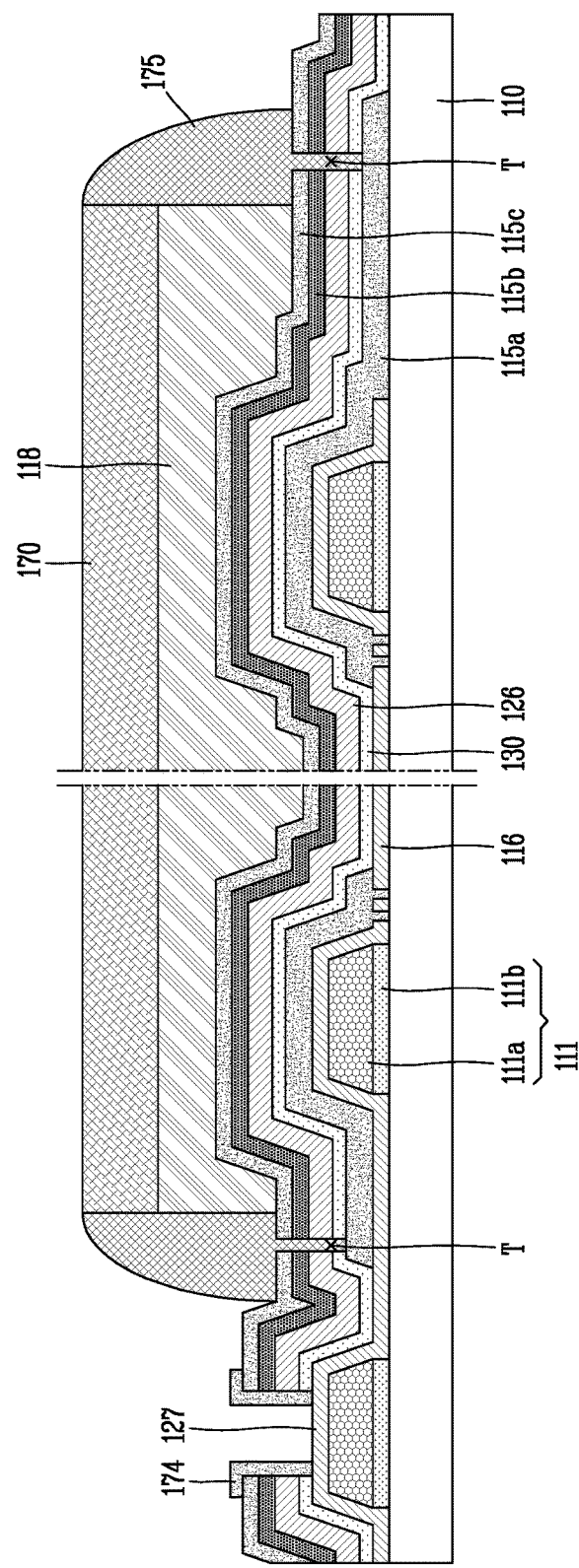

Afterwards, as illustrated in FIGS. 7F and 9F, Ag is printed to form the second contact electrode 175 on side surfaces of the metal film 170 and the adhesive 118 along the outer periphery of the metal film 170.

At this time, the second contact electrode 175 may be filled even in the trench T. In addition, the present disclosure is not limited to the printing process, and may employ various methods such as screen printing and inkjet printing.

In addition, the lighting apparatus may be completely fabricated by attaching the non-conductive protective film 174 such as a barrier tape or laminating the passivation layer within the contact hole 114.

In this instance, the first and second contact electrodes 127 and 175 are electrically connected to the outside to apply a signal to the lighting portion. Specifically, the second contact electrode 175 may prevent moisture permeation through the side surface, together with the trench T. That is, the contact portion where moisture may permeate is additionally protected by being covered with the protective film 174 and the second contact electrode 175, thereby ensuring reliability.

As described above, the aspect of the present disclosure exemplarily illustrates that the first electrode 116 extends to the first contact portion of the substrate 110 to form the first contact electrode 127. However, the present disclosure is not limited thereto. The present disclosure may further form the first contact electrode through the printing process within the contact hole in which the protection film is disposed, which will be described in detail with reference to another aspect of the present disclosure.

Figure 10:
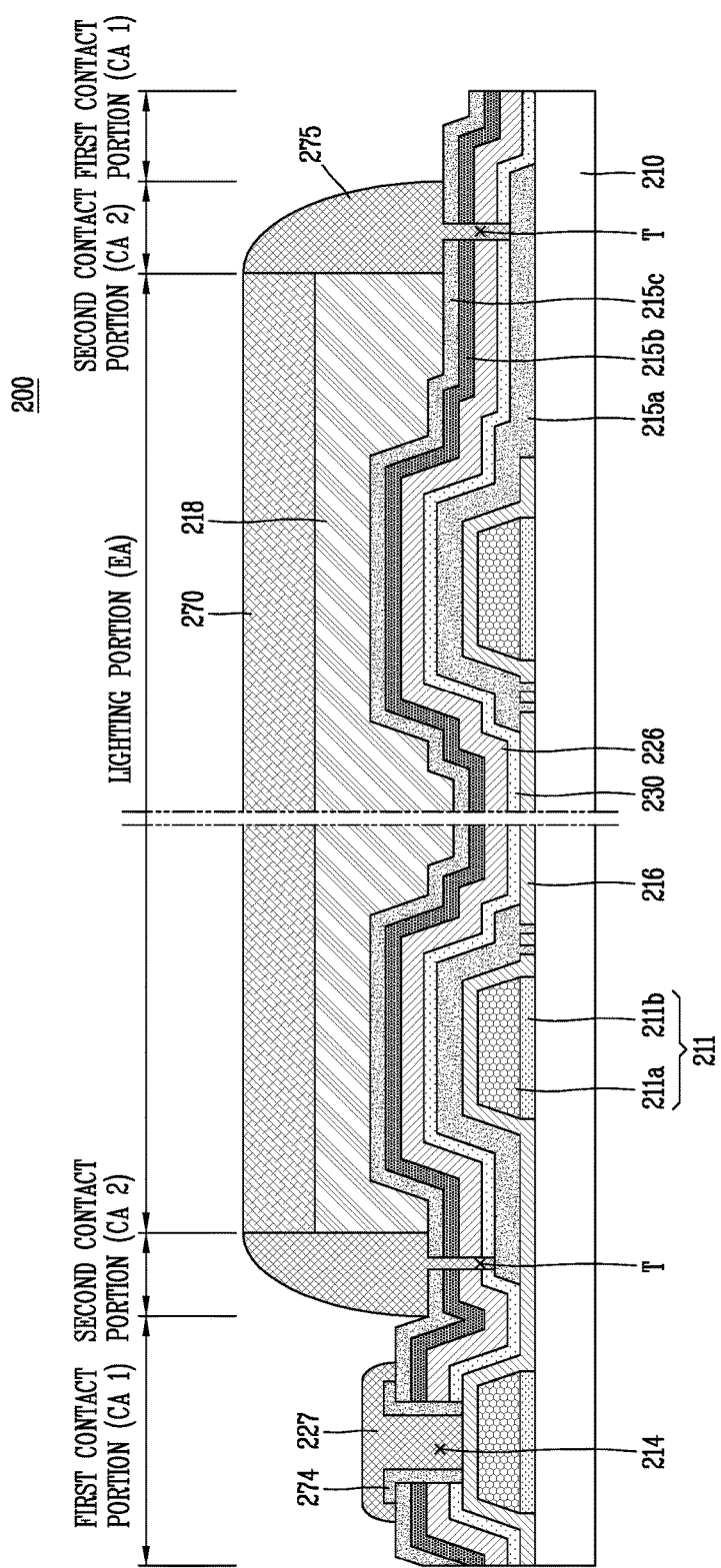
FIG. 10 is a schematic view illustrating a cross-section of a lighting apparatus using an organic light emitting diode in accordance with another aspect of the present disclosure.

FIG. 10 is a schematic sectional view of a lighting apparatus using an organic light emitting diode according to another aspect of the present disclosure.

In this instance, the lighting apparatus using the organic light emitting diode according to another aspect of the present disclosure illustrated in FIG. 10 has substantially the same configuration as the lighting apparatus using the organic light emitting diode according to the foregoing aspect of the present disclosure except for a first contact electrode.

That is, the lighting apparatus using the organic light emitting diode according to the another aspect of the present disclosure may include an organic light emitting diode part for actually emitting light and an encapsulating part for encapsulating the organic light emitting diode part.

In this instance, the organic light emitting diode part is configured as an organic light emitting diode provided on a substrate. Referring to FIG. 10, a substrate 210 may include a lighting portion EA for actually emitting light to the outside, and contact portions CA1 and CA2 electrically connected to the outside through contact electrodes 227 and 275 for applying a signal to the lighting portion EA.

The contact portions CA1 and CA2 are not covered with an encapsulating member of a metal film 270 and thus may be electrically connected to the outside through the contact electrodes 227 and 275.

In this instance, the contact portions CA1 and CA2 are located outside the lighting portion EA, the second contact portion CA2 is located along the outer periphery of the lighting portion EA, and the first contact portion CA1 is located outside the second contact portion CA2. Therefore, the metal film 270 may be attached to an entire surface of the lighting portion EA of the substrate 210 except for the contact portions CA1 and CA2.

Accordingly, the first contact portion CA1 may be located along the outer periphery of the second contact portion CA2 and the first contact electrode 227 may be provided at an arbitrary position of the first contact portion CA1. The second contact electrode 275 may be provided on side surfaces of the metal film 270 and an adhesive 218 along the outer periphery of the metal film 270.

A first electrode 216 and a second electrode 226 may be disposed on the substrate 210 and an organic light emitting layer 230 may be disposed between the first electrode 216 and the second electrode 226, thereby forming an organic light emitting diode.

In this instance, although a rigid material such as glass may be used as the substrate 210, the lighting apparatus 200 which is bendable or curvable may be fabricated by using a material having flexibility such as plastic. Also, in the present disclosure, with use of the plastic material having flexibility as the substrate 210, a process using a roll can be allowed and thus the lighting apparatus 200 can be fabricated fast.

The first electrode 216 is formed on the lighting portion EA and the first and second contact portions CA1 and CA2 and may be made of a transparent conductive material having high conductivity and work function.

An auxiliary electrode 211 may be disposed on the lighting portion EA and the first contact portion CA1 of the substrate 210 to be electrically connected to the first electrode 216.

The auxiliary electrode 211 is arranged in a thin matrix form, a mesh form, a hexagonal or octagonal form, a circular form, or the like throughout the entire lighting portion EA, such that current can be uniformly applied to the first electrode 216 on the entire lighting portion EA. This may allow the large lighting apparatus 200 to emit light with uniform luminance.

Although the example in which the auxiliary electrode 211 is disposed on a lower portion of the first electrode 216 is illustrated in the drawing, the present disclosure is not limited thereto. The auxiliary electrode 211 may alternatively be disposed on an upper portion of the first electrode 216. The auxiliary electrode 211 disposed on the first contact portion CA1 may be used as a path for supplying current to the first electrode 216 through the first contact electrode 227.

The auxiliary electrode 211 may be made of a metal having high conductivity such as Al, Au, Cu, Ti, W, Mo, or an alloy thereof. The auxiliary electrode 211 may have a two-layered structure including an upper auxiliary electrode 211a and a lower auxiliary electrode 211b, but the present disclosure is not limited thereto. The auxiliary electrode 211 may alternatively be formed as a single layer.

The first passivation layer 215a may be laminated on parts of the lighting portion EA and the first and second contact portions CA1 and CA2 of the substrate 210.

The first passivation layer 215a disposed on the lighting portion EA is configured to cover the auxiliary electrode 211 and the first electrode 216 disposed on the auxiliary electrode 211, but is not arranged on the light emitting area from which light is actually emitted. Specifically, the first passivation layer 215a of the lighting portion EA is formed to surround the auxiliary electrode 211 so as to reduce a stepped portion (or step coverage) caused by the auxiliary electrode 211. Accordingly, various layers to be formed later can be stably formed.

The first passivation layer 215a may be made of an inorganic material such as $SiO_x$ or $SiN_x$. However, the first passivation layer 215a may be made of an organic material such as photoacryl, or may be formed as a plurality of layers of an inorganic material and an organic material.

The lighting apparatus 200 using the organic light emitting diode according to the another aspect of the present disclosure may be formed substantially the same as the foregoing aspect of the present disclosure in that the organic light emitting layer 230, the second electrode 226, and the second and third passivation layers 215b and 215c are disposed on the entire surface of the substrate 210 with the first electrode 212 and the first passivation layer 215a thereon.

That is, the lighting apparatus 200 using the organic light emitting diode according to the another aspect of the present disclosure is configured in a manner that the organic light emitting layer 230, the second electrode 226, and the second and third passivation layers 215b and 215c are deposited on the entire surface of the substrate 210 without an open mask as a separate sophisticated apparatus, encapsulated with the metal film, and then patterned through laser ablation, so as to form the contact electrodes 227 and 275.

As described above, the organic light emitting layer 230 which is a white organic light emitting layer may include a red light emitting layer, a blue light emitting layer, and a green light emitting layer, or have a tandem structure including a blue light emitting layer and a yellow-green light emitting layer. The organic light emitting layer 230 may include an electron injection layer and a hole injection layer for injecting electrons and holes respectively into the light emitting layer, an electron transport layer and a hole transport layer for transporting the injected electrons and holes to the light emitting layer, and a charge generation layer for generating charges such as the electrons and holes.

The second electrode 226 may be made of a metal such as Al, Mo, Cu Ag, or an alloy such as MoTi.

The second passivation layer 215b may be made of an organic material such as photoacryl. In addition, the third passivation layer 215c may be made of an inorganic material such as $SiO_x$ or $SiN_x$. However, the present disclosure is not limited thereto.

A predetermined encapsulant may further be provided on the third passivation layer 215c. The encapsulant may be an epoxy compound, an acrylate compound, an acrylic compound, or the like.

An adhesive 218 such as PSA is coated on the third passivation layer 215c and a metal film 270 is disposed on the adhesive 218, such that the metal film 270 is attached to the third passivation layer 215c to encapsulate the lighting apparatus 200.

The adhesive 218 may be a photocurable adhesive or a thermosetting adhesive.

At this time, portions of the organic light emitting layer 230, the second electrode 226, and the second and third passivation layers 215b and 215c of the second contact portion CA2 of the substrate 210 are removed through the laser ablation to form a trench T, and accordingly the surface of the first passivation layer 215a may be exposed through the trench T.

The organic light emitting layer 230, the second electrode 226 and the second and third passivation layers 215b and 215c of the first contact portion CA1 of the substrate 210 may be removed through the laser ablation to form a first contact hole 214 for exposing the electrode 216 therethrough.

A non-conductive protection film 274 such as a barrier tape may be attached or a passivation layer may be laminated in the contact hole 214. That is, the protection film 274 covers a side surface within the contact hole 214 (that is, side surfaces of the organic light emitting layer 230, the second electrode 226 and the second and third passivation layers 215b and 215c in the contact hole 214), and parts of surfaces of the third passivation layer 215c and the first electrode 216, so as to prevent water permeation, together with the trench T. As such, the present disclosure can improve reliability of the lighting apparatus by preventing the penetration of moisture in the manner of covering the side surface of the contact hole 214 exposed by the protection film 274.

The present disclosure is also configured such that the second contact electrode 275 is formed on side surfaces of the metal film 270 and the adhesive 218 along the outer periphery of the metal film 270 through a printing process. At this time, the second contact electrode 275 may also be filled in the trench T. However, the present disclosure is not limited to the printing process, and may alternatively employ various methods such as screen printing and inkjet printing.

In addition, the first contact electrode 227 may be additionally formed in the contact hole 214 with the protection film 274 through the printing process. At this time, the first contact electrode 227 may cover parts of upper surfaces of the protection film 274 and the third passivation layer 215c, as well as the inside of the contact hole 214.

In this manner, the first contact electrode 227 can be electrically connected to the first electrode 216 through the contact hole 214 and prevent the moisture permeation by filling the inside of the contact hole 214 together with the protection film 274. And, the second contact electrode 275 may allow for a cathode contact, the protection of the side surface of the encapsulating means (that is, the metal film 270 and the adhesive 218), and the prevention of the moisture permeation through the trench T.

In addition, since the laser processing (i.e., laser ablation) is performed after the encapsulation with the metal film 270, the present disclosure can prevent a defect caused by particles generated during the laser processing. In addition, since the contact portions CA1 and CA2 where moisture is likely to be introduced can be additionally protected by being covered using the protection film 274 and the first and second contact electrodes 227 and 275, reliability of the lighting apparatus can be secured.

As the present disclosure may be embodied in several forms without departing from the characteristics thereof, it should also be understood that the above-described aspects are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A lighting apparatus using an organic light emitting diode, the apparatus comprising:
   a substrate having a lighting portion, and first and second contact portions;
   a first electrode on the substrate;
   a first passivation layer on the first electrode and including areas that are configured not to emit light;
   an organic light emitting layer, a second electrode, and a second passivation layer on the second electrode, wherein the organic light emitting layer, the second electrode, and the second passivation layer are provided on an entire surface of the substrate including the first passivation layer;
   a trench at the second contact portion of the substrate disconnecting each of the organic light emitting layer, the second electrode, and the second passivation layer of the lighting portion from corresponding layers of the second contact portion; and
   a metal film over the substrate including the second passivation layer at the lighting portion,
   wherein the first and second contact portions located outside the lighting portion are configured to allow electrical connection to the first and second electrodes, respectively.

2. The apparatus of claim 1, wherein the second contact portion is located along an outer periphery of the lighting portion, and the first contact portion is located along an outer periphery of the second contact portion.

3. The apparatus of claim 1, wherein the first electrode extends to the first contact portion to become a first contact electrode.

4. The apparatus of claim 3, further comprising a contact hole at the first contact portion.

5. The apparatus of claim 4, wherein the contact hole is formed by removing portions of the organic light emitting layer, the second electrode, and the second passivation layer at the first contact portion, and exposing a portion of the first contact electrode.

6. The apparatus of claim 5, further comprising a protection film covering an inner side surface of the contact hole and portions of surfaces of the first contact electrode and the second passivation layer.

7. The apparatus of claim 1, further comprising a second contact electrode on a side surface of the metal film.

8. The apparatus of claim 7, further comprising an adhesive attaching the metal film onto the second passivation layer.

9. The apparatus of claim 7, wherein the second contact electrode is filled in the trench and electrically connected to the second electrode.

10. The apparatus of claim 1, wherein the trench is formed by removing portions of the organic light emitting layer, the second electrode and the second passivation layer at the second contact portion so as to expose a portion the first passivation layer.

11. The apparatus of claim 1, wherein the trench has a shape of a rectangular frame along a periphery of the lighting portion within the second contact portion of the substrate.

12. The apparatus of claim 6, further comprising a third contact electrode in the contact hole contacting the first contact electrode and the protective film.

* * * * *